US008896757B2

(12) United States Patent
Matsumoto

(10) Patent No.: US 8,896,757 B2
(45) Date of Patent: Nov. 25, 2014

(54) DELTA-SIGMA A/D CONVERTER, LIMITER CIRCUIT AND TELEVISION RECEIVER

(71) Applicant: Sony Corporation, Tokyo (JP)

(72) Inventor: Tomohiro Matsumoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/961,640

(22) Filed: Aug. 7, 2013

(65) Prior Publication Data

US 2014/0055676 A1 Feb. 27, 2014

(30) Foreign Application Priority Data

Aug. 27, 2012 (JP) .................................. 2012-186724
Aug. 27, 2012 (JP) .................................. 2012-186726

(51) Int. Cl.
*H03M 1/12* (2006.01)
*H04N 21/426* (2011.01)
*H04N 5/44* (2011.01)
*H03M 3/00* (2006.01)

(52) U.S. Cl.
CPC ......... *H03M 3/458* (2013.01); *H04N 21/42607* (2013.01); *H04N 5/4401* (2013.01); *H03M 3/358* (2013.01); *H03M 3/422* (2013.01); *H04N 5/44* (2013.01); *H03M 3/44* (2013.01)
USPC ........... 348/572; 348/571; 348/573; 348/639; 348/657; 348/660; 348/690; 348/646; 348/651; 348/720; 348/737; 348/730; 348/733; 341/143; 341/141; 341/142; 341/144; 341/155; 341/158; 341/172; 341/200; 341/120; 341/118

(58) Field of Classification Search
USPC ......... 348/572, 571, 573, 639, 657, 660, 690, 348/646, 651, 720, 737, 730, 733; 341/143, 341/142, 144, 155, 158, 200, 120, 118, 172
See application file for complete search history.

(56) References Cited

U.S. PATENT DOCUMENTS

| 6,384,761 | B1 * | 5/2002 | Melanson ...................... 341/143 |
| 6,744,392 | B2 * | 6/2004 | Melanson ...................... 341/143 |
| 6,956,514 | B1 * | 10/2005 | Melanson et al. ............ 341/143 |
| 7,167,119 | B1 * | 1/2007 | Lei et al. ....................... 341/143 |
| 7,446,686 | B2 * | 11/2008 | Rueger et al. ................. 341/143 |
| 7,567,194 | B2 * | 7/2009 | Hasegawa ..................... 341/143 |
| 8,207,879 | B2 * | 6/2012 | Uo et al. ....................... 341/110 |
| 2003/0227401 | A1 * | 12/2003 | Yang et al. .................... 341/143 |
| 2004/0108947 | A1 * | 6/2004 | Yang et al. .................... 341/143 |
| 2004/0128279 | A1 * | 7/2004 | Matsuura et al. ................ 707/1 |
| 2008/0074303 | A1 * | 3/2008 | Rueger et al. ................. 341/143 |
| 2008/0316075 | A1 * | 12/2008 | Hasegawa ..................... 341/143 |
| 2010/0309032 | A1 * | 12/2010 | Uo et al. ....................... 341/110 |

FOREIGN PATENT DOCUMENTS

JP 2010-263483 11/2010

* cited by examiner

*Primary Examiner* — Jefferey Harold
*Assistant Examiner* — Mustafizur Rahman
(74) *Attorney, Agent, or Firm* — Sony Corporatio

(57) ABSTRACT

There is provided a delta-sigma A/D converter including a first integrator, a second integrator located on an output side of the first integrator, a quantizer located on an output side of the second integrator, and a first current D/A converter receiving an output of the quantizer and providing a negative feedback signal to an input side of the quantizer.

5 Claims, 17 Drawing Sheets

A               B

601 LIMITER CIRCUIT

701 LIMITER CIRCUIT

DELTA-SIGMA A/D CONVERTER, LIMITER CIRCUIT AND TELEVISION RECEIVER

BACKGROUND

The present disclosure relates to a delta-sigma A/D converter, a limiter circuit used for the same and a television receiver using the delta-sigma A/D converter.

As is well known, the present television broadcasting in our country is digital broadcasting. Television receivers are employing digital demodulation circuits attaining demodulation for high quality signals from the digital broadcasting.

FIG. 10 is a block diagram of a television receiver according to an existing technology.

A high frequency signal according to a radio wave received by an antenna 102 is amplified by a high frequency amplifier (hereinafter abbreviated as "RF amplifier") 103, and after that, inputted to two mixers.

To the first mixer 104, a local oscillation signal is inputted from a PLL (Phase Locked Loop) 105 which is a known local oscillator, and an I-channel signal as an intermediate frequency signal (hereinafter abbreviated as "IF") is outputted therefrom.

To the second mixer 106, a local oscillation signal obtained by 90-degree phase shift on the local oscillation signal of the PLL 105 by a 90-degree phase shifter 107 is inputted, and a Q-channel signal as an IF is outputted therefrom.

The I-channel signal and Q-channel signal are inputted to a polyphase filter 1002 and their noise components are removed therefrom. After that, they are converted into digital signals by a Nyquist A/D converter 1003 and inputted to a demodulator 1004. The demodulator 1004 performs demodulation to obtain a video signal and a voice signal from the digital signals and supplies the video signal and voice signal to a display 114 and a loud speaker 115, respectively.

In addition, Japanese Patent Laid-Open No. 2010-263483 (hereinafter referred to as Patent Literature 1) is a document disclosing a technology seeming to be similar to the present disclosure.

SUMMARY

Digital demodulation processing of the television signal should suppress the frequency of the IF as low as possible. In the current technical trend, the frequency of the IF is selected to be approximately 5 to 6 MHz. In realizing a television receiver using the low frequency IF, when a radio wave to be received actually, that is, a radio wave in a channel adjacent to a desired channel is converted into the IF by the mixer, it can be similarly converted into an image signal as it is, causing cross talk and noise. The image reduction is difficult in realizing a low IF receiver.

The television receiver should have an image reduction ratio of 60 dB expected for demodulation of the desired channel without any difficulty. An analog circuit to attain such a high C/N ratio should have circuit elements with high precision constituting a polyphase filter and PLL. While normal mismatch for circuit elements is approximately 1%, such an extent of mismatch can only secure an image reduction ratio of approximately 40 dB. Therefore, existing technologies are taking extensive efforts such as contrivances for circuit layout and strict selection of circuit elements in order to improve the mismatch of circuit elements. Moreover, yield of the television receivers is deteriorating for the reason.

As above, since analog circuits are difficult to realize a polyphase filter attaining sufficient image reduction performance, the applicants and inventors have been studying conversion of a signal received upstream of a polyphase filter into a digital one, and after that, attainment of the image reduction performance with the polyphase filter which operates in a digital manner.

Employing a delta-sigma A/D converter (hereinafter presented as "$\Delta\Sigma$ A/D converter") which has a wide dynamic range in place of a Nyquist A/D converter enables to convert the signal including the image signal into a digital form, this enabling the polyphase filter to operate in a digital manner. In particular, the $\Delta\Sigma$ A/D converter including integrators in a multi-stage manner which are its constituents widens a dynamic range within a pass band, allowing quantization noise to be shunted out of the pass band. Moreover, since the $\Delta\Sigma$ A/D converter has high linearity, its employment for a television receiver can lead to receiving performance in high quality.

On the other hand, the $\Delta\Sigma$ A/D converter configured in a multi-stage manner leads to usage of operational amplifiers configured in a multi-stage manner (an actual $\Delta\Sigma$ A/D converter uses fully-differential amplifiers). Such usage of operational amplifiers configured in a multi-stage manner also leads to increasing components and increasing costs.

Moreover, the $\Delta\Sigma$ A/D converter configured in a multi-stage manner has a property of weakness against excess input as a demerit by nature which a Nyquist A/D converter does not have. Since the $\Delta\Sigma$ A/D converter includes a feedback loop, the output diverges just upon excess input. In other words, it causes oscillation and normal operation is not expected after that.

In order to prevent such excess input, a television receiver according to an existing technology includes a known AGC regulating the amplification ratio of the RF amplifier when the excess input is detected in the demodulator. However, such detection in the demodulator leads to the excess input having already been inputted in the $\Delta\Sigma$ A/D converter, this disabling such an AGC to prevent the excess input to the $\Delta\Sigma$ A/D converter by nature.

It is desirable to provide a delta-sigma A/D converter and a limiter circuit used for the same capable of attaining sufficient characteristics using a minimum number of operational amplifiers and to provide a television receiver using the delta-sigma A/D converter.

According to an embodiment of the present disclosure, there is provided a delta-sigma A/D converter including a first integrator, a second integrator located on an output side of the first integrator, a quantizer located on an output side of the second integrator, and a first current D/A converter receiving an output of the quantizer and providing a negative feedback signal to an input side of the quantizer.

Further, according to an embodiment of the present disclosure, there is provided a limiter circuit including a reference voltage source outputting a reference voltage equal to an allowed input voltage of the delta-sigma A/D converter, a comparator comparing the reference voltage of the reference voltage source with a voltage of an input signal to convert a logical state when the voltage of the input signal exceeds the reference voltage, and a switch circuit providing, upon the comparator determining that the voltage of the input signal exceeds the reference voltage, a signal at a level equal to a level of the reference voltage to an input terminal of the delta-sigma A/D converter.

Moreover, according to an embodiment of the present disclosure, there is provided a television receiver including: an RF amplifier amplifying a radio wave received from an antenna; a local oscillator; a 90-degree phase shifter performing 90-degree phase shift on a phase of a signal outputted by the local oscillator; a first mixer connected to the RF amplifier and the local oscillator and outputting an I-channel signal which is an intermediate frequency signal; and a second mixer connected to the RF amplifier and the 90-degree phase shifter and outputting a Q-channel signal which is an intermediate frequency signal.

Furthermore, a first delta-sigma A/D converter includes: a first integrator; a second integrator located on an output side of the first integrator; a quantizer located on an output side of the second integrator; and a first current D/A converter receiving an output of the quantizer and giving a negative feedback signal to an input side of the quantizer.

In addition to these, a second delta-sigma A/D converter has the same configuration as the first delta-sigma A/D converter.

Moreover, a first limiter circuit gives, when a voltage of the I-channel signal exceeds an allowed input voltage of the first delta-sigma A/D converter, a signal at a level equal to a level of the allowed input voltage to an input terminal of the first delta-sigma A/D converter.

Moreover, a second limiter circuit gives, when a voltage of the Q-channel signal exceeds an allowed input voltage of the first delta-sigma A/D converter, a signal at a level equal to a level of the allowed input voltage to an input terminal of the second delta-sigma A/D converter.

Moreover, a digital signal processing part receives a digital I-channel signal outputted from the first delta-sigma A/D converter and a digital Q-channel signal outputted from the second delta-sigma A/D converter to perform predetermined filter processing and demodulation processing.

According to embodiments of the present disclosure, there can be provided a delta-sigma A/D converter capable of attaining sufficient characteristics using a minimum number of operational amplifiers and a television receiver using the delta-sigma A/D converter. Furthermore, there can be provided a limiter circuit used for the delta-sigma A/D converter capable of preventing excess input from occurring and a television receiver using the limiter circuit.

Other aspects, configurations and advantages will be apparent from the following description of the embodiments.

DETAILED DESCRIPTION OF THE EMBODIMENTS

Figure 1:
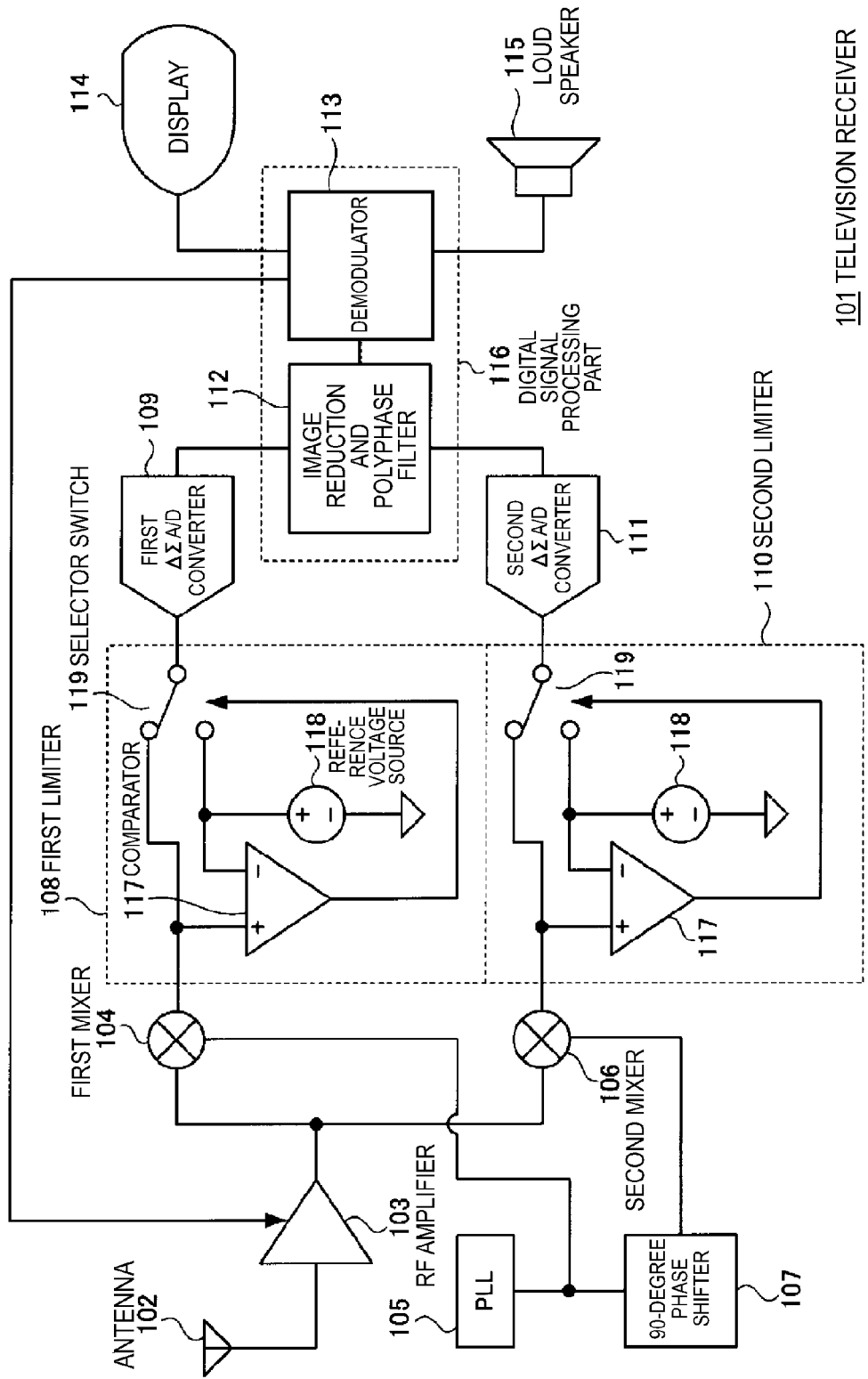
FIG. 1 is a block diagram of a television receiver according to an embodiment of the present disclosure.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

[Entire Configuration of Television Receiver]

FIG. 1 a block diagram of a television receiver according to an embodiment of the present disclosure.

A high frequency signal according to a radio wave received by an antenna 102 is amplified by an RF amplifier 103, and after that, inputted to two mixers.

To a first mixer 104, a local oscillation signal is inputted from a PLL 105 which is a known local oscillator, and therefrom, an I-channel signal as an IF is outputted.

To a second mixer 106, a local oscillation signal obtained by 90-degree phase shift on the local oscillation signal of the PLL 105 by a 90-degree phase shifter 107 is inputted, and therefrom, a Q-channel signal as an IF is outputted.

The I-channel signal is inputted to a first ΔΣ A/D converter 109. The Q-channel signal is inputted to a second ΔΣ A/D converter 111 also similarly to the I-channel signal. In addition, the first ΔΣ A/D converter 109 and second ΔΣ A/D converter 111 have the same configuration.

The I-channel signal converted into a digital form by the first ΔΣ A/D converter 109 and the Q-channel signal converted into a digital form by the second ΔΣ A/D converter 111 are inputted independently to an image reduction and polyphase filter 112 and an image signal component causing noise and cross talk is removed therefrom. Then, a demodulator 113 demodulates a video signal and a voice signal from the I-channel signal and Q-channel signal in a digital form, and supplies the video signal to a display 114 and the voice signal to a loud speaker 115.

Both the image reduction and polyphase filter 112 and the demodulator 113 are digital circuits and constitute a digital signal processing part 116 on an integrated circuit.

[Circuit Configuration of ΔΣ A/D Converter]

Figure 2:
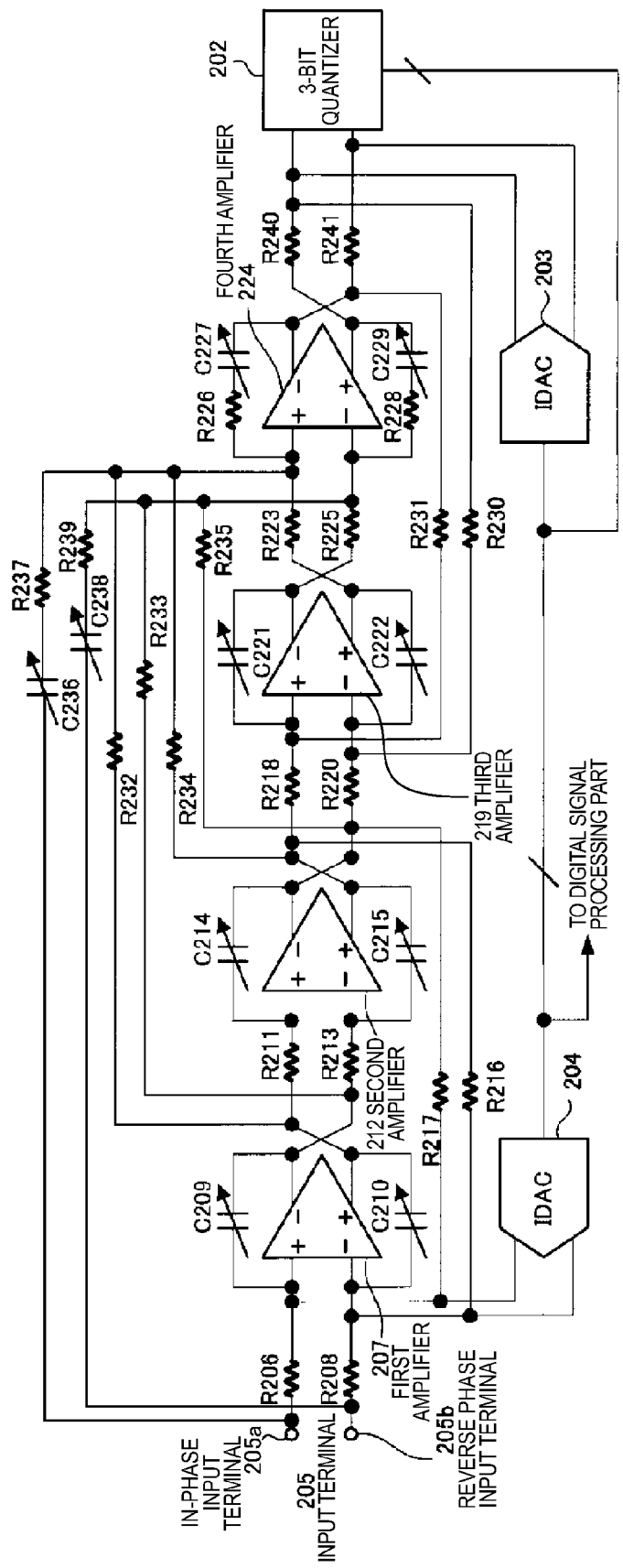
FIG. 2 is a circuit diagram of a ΔΣ A/D converter according to the embodiment.

FIG. 2 is a circuit diagram of a ΔΣ A/D converter according to the embodiment.

A ΔΣ A/D converter 201 includes four integrators configured of fully-differential amplifiers, a 3-bit quantizer 202, a current D/A converter (hereinafter abbreviated as "IDAC") 203 and an IDAC 204.

To an in-phase input terminal 205a of an input terminal 205 of the ΔΣ A/D converter 201 to which terminal the I-channel signal or Q-channel signal in a form of a differential analog signal (hereinafter abbreviated as "input analog signal") is inputted, the positive side input terminal of a first amplifier 207 is connected via a resistor R206 and an in-phase input signal is inputted.

Similarly, to a reverse phase input terminal 205b of the input terminal 205 of the ΔΣ A/D converter 201 to which terminal the input analog signal is inputted, the negative side input terminal of a first amplifier 207 is connected via a resistor R208 and a reverse phase input signal is inputted.

A variable capacitor C209 is connected between the positive side input terminal and the negative side output terminal of the first amplifier 207.

A variable capacitor C210 is connected between the negative side input terminal and the positive side output terminal of the first amplifier 207.

Accordingly, the first amplifier 207 functions as an integrator.

The first amplifier 207 is also an adder of the input analog signal and a feedback signal mentioned later as well as the integrator.

To the positive side output terminal of the first amplifier 207, the positive side input terminal of a second amplifier 212 is connected via a resistor R211.

To the negative side output terminal of the first amplifier 207, the negative side input terminal of the second amplifier 212 is connected via a resistor R213.

A variable capacitor C214 is connected between the positive side input terminal and the negative side output terminal of the second amplifier 212.

A variable capacitor C215 is connected between the negative side input terminal and the positive side output terminal of the second amplifier 212.

Accordingly, the second amplifier 212 functions as an integrator.

A resistor R216 is connected as a feedback control line between the positive side output terminal of the second amplifier 212 and the negative side input terminal of the first amplifier 207.

A resistor R217 is connected as a feedback control line between the negative side output terminal of the second amplifier 212 and the positive side input terminal of the first amplifier 207.

To the positive side output terminal of the second amplifier 212, the positive side input terminal of a third amplifier 219 is connected via a resistor R218.

To the negative side output terminal of the second amplifier 212, the negative side input terminal of the third amplifier 219 is connected via a resistor R220.

A variable capacitor C221 is connected between the positive side input terminal and the negative side output terminal of the third amplifier 219.

A variable capacitor C222 is connected between the negative side input terminal and the positive side output terminal of the third amplifier 219.

Accordingly, the third amplifier 219 functions as an integrator.

The third amplifier 219 is also an adder of the output signal of the second amplifier 212 and a feedback signal mentioned later as well as the integrator.

To the positive side output terminal of the third amplifier 219, the positive side input terminal of a fourth amplifier 224 is connected via a resistor R223.

To the negative side output terminal of the third amplifier 219, the negative side input terminal of the fourth amplifier 224 is connected via a resistor R225.

A resistor R226 and a variable capacitor C227 are connected in series between the positive side input terminal and the negative side output terminal of the fourth amplifier 224.

A resistor R228 and a variable capacitor C229 are connected in series between the negative side input terminal and the positive side output terminal of the fourth amplifier 224.

Accordingly, the fourth amplifier 224 functions as an integrator.

The fourth amplifier 224 is also an adder of the output signal of the third amplifier 219 and a feedforward signal mentioned later as well as the integrator.

A resistor R230 is connected as a feedback control line between the positive side output terminal of the fourth amplifier 224 and the negative side input terminal of the third amplifier 219.

A resistor R231 is connected as a feedback control line between the negative side output terminal of the fourth amplifier 224 and the positive side input terminal of the third amplifier 219.

A resistor R232 is connected as a feedforward control line between the positive side output terminal of the first amplifier 207 and the positive side input terminal of the fourth amplifier 224.

A resistor R233 is connected as a feedforward control line between the negative side output terminal of the first amplifier 207 and the negative side input terminal of the fourth amplifier 224.

A resistor R234 is connected as a feedforward control line between the positive side output terminal of the second amplifier 212 and the positive side input terminal of the fourth amplifier 224.

A resistor R235 is connected as a feedforward control line between the negative side output terminal of the second amplifier 212 and the negative side input terminal of the fourth amplifier 224.

A variable capacitor C236 as a derivative element and a resistor R237 are connected in series as a feedforward control line between the in-phase input terminal 205*a* of the input terminal 205 and the positive side input terminal of the fourth amplifier 224.

A variable capacitor C238 as a derivative element and a resistor R239 are connected in series as a feedforward control line between the reverse phase input terminal 205*b* of the input terminal 205 and the negative side input terminal of the fourth amplifier 224.

The positive side output terminal of the fourth amplifier 224 is connected to the quantizer 202 via a resistor R240. The negative side output terminal of the fourth amplifier 224 is connected to the quantizer 202 via a resistor R241. The quantizer 202 performs quantization processing on the output signal of the fourth amplifier 224. A digital signal obtained by 3-bit quantization is inputted to the IDAC 203.

The output signal lines of the IDAC 203 are connected to the input terminals of the quantizer 202, respectively.

The fourth amplifier 224 is also an adder of the feedforward control lines of the input terminal 205 of the $\Delta\Sigma$ A/D converter 201, the output terminal of the first amplifier 207 and the output terminal of the second amplifier 212 as well as the integrator.

The resistor R240 connected to the positive side output terminal of the fourth amplifier 224 and the resistor R241 connected to the negative side output terminal of the fourth amplifier 224 are important for a feedback function operating normally in the $\Delta\Sigma$ A/D converter 201 according to the embodiment.

The digital signal having undergone 3-bit quantization by the quantizer 202 is inputted to the digital signal processing part 116 downstream.

Meanwhile, the digital signal having undergone 3-bit quantization is also inputted to the IDAC 204. The output terminal of the IDAC 204 is connected as a feedback control line to the input terminal of the first amplifier 207.

As described above, the ΔΣ A/D converter 201 is constituted of the integrators which are in four stages, the quantizer 202, the feedback control lines and the feedforward control lines.

[Circuit Configuration of IDAC]

Figure 3:
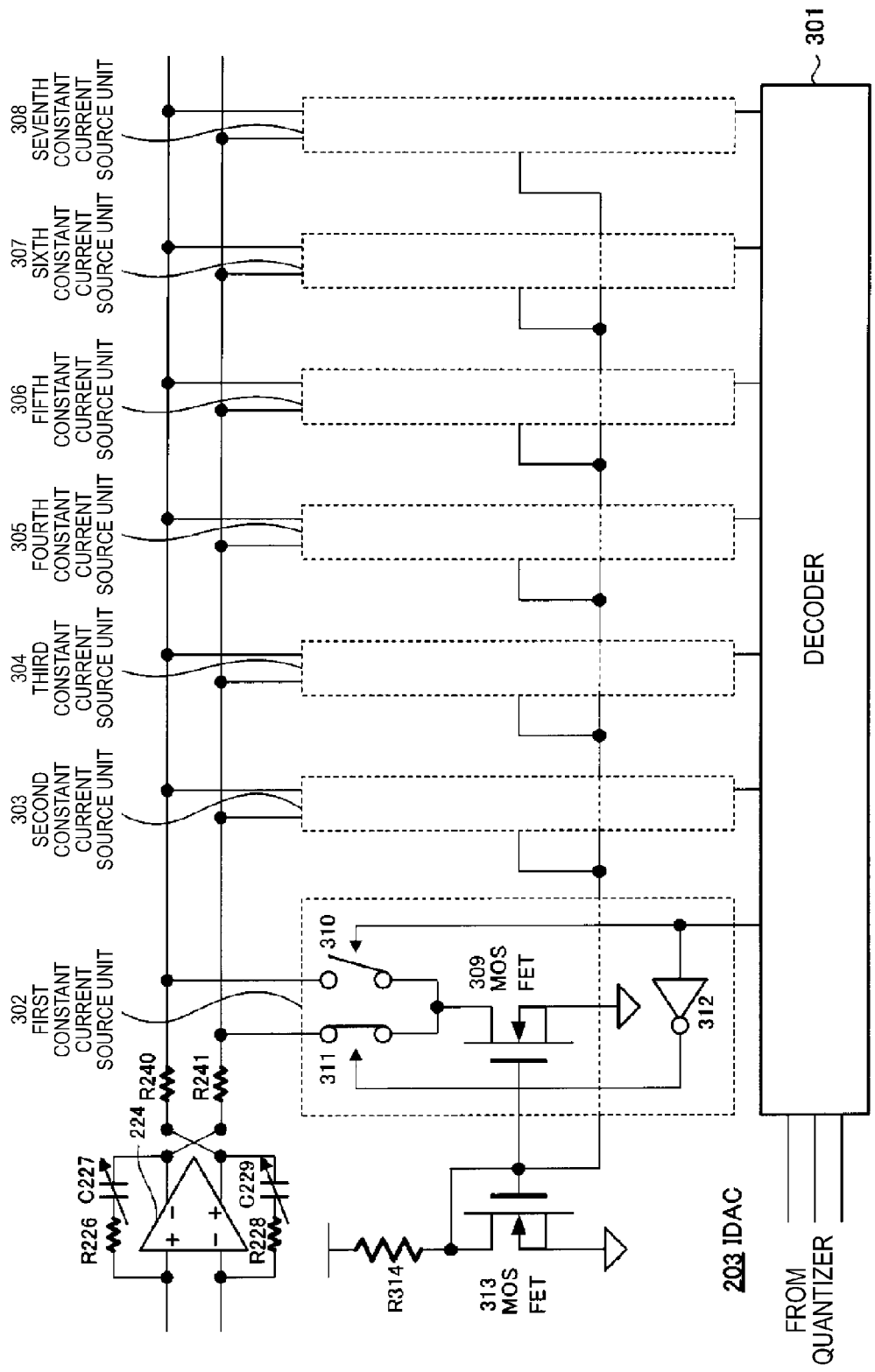
FIG. 3 is a circuit diagram of an IDAC.

FIG. 3 is a circuit diagram of the IDAC 203. In addition, since the IDAC 204 also has the same circuit configuration as that of the IDAC 203, only the IDAC 203 is described in FIG. 3 and FIG. 4 mentioned later.

The IDAC 203 includes a decoder 301, 7 constant current source units and a MOS-FET 313 supplying a reference voltage to the 7 constant current source units.

The 3-bit digital signal outputted from the quantizer 202 is inputted to the decoder 301.

The decoder 301 is connected to the 7 constant current source units and controls the 7 constant current source units according to the 3-bit digital signal.

The first constant current source unit 302, second constant current source unit 303, third constant current source unit 304, fourth constant current source unit 305, fifth constant current source unit 306, sixth constant current source unit 307 and seventh constant current source unit 308 all have the same configuration.

The source of a MOS-FET 309 is grounded. To the drain of the MOS-FET 309, two transistor switches are connected in parallel. The first transistor switch 310 and second transistor switch 311 are connected to the resistor R240 connected to the positive side output terminal of the fourth amplifier 224 and the resistor R241 connected to the negative side output terminal of the fourth amplifier 224, respectively.

The first transistor switch 310 and second transistor switch 311 are exclusively controlled to be ON or OFF via a NOT gate 312 according to a control signal outputted from the decoder 301.

In the MOS-FET 313, its drain and source are directly connected and the drain is connected to a power supply voltage via a resistor R314. Therefore, the MOS-FET 313 configures a known constant current source circuit. Accordingly, the MOS-FET 309 also configures a constant current source by the gate voltage of the MOS-FET 313 applied to the gate of the MOS-FET 309.

The drain of the MOS-FET 309 is exclusively connected to the resistor R240 connected to the positive side output terminal of the fourth amplifier 224 or the resistor R241 connected to the negative side output terminal thereof, and allows an output current of the fourth amplifier 224 to flow to the ground. In other words, the MOS-FET 309 configures a feedback loop for the current input of the quantizer 202.

Figure 4:
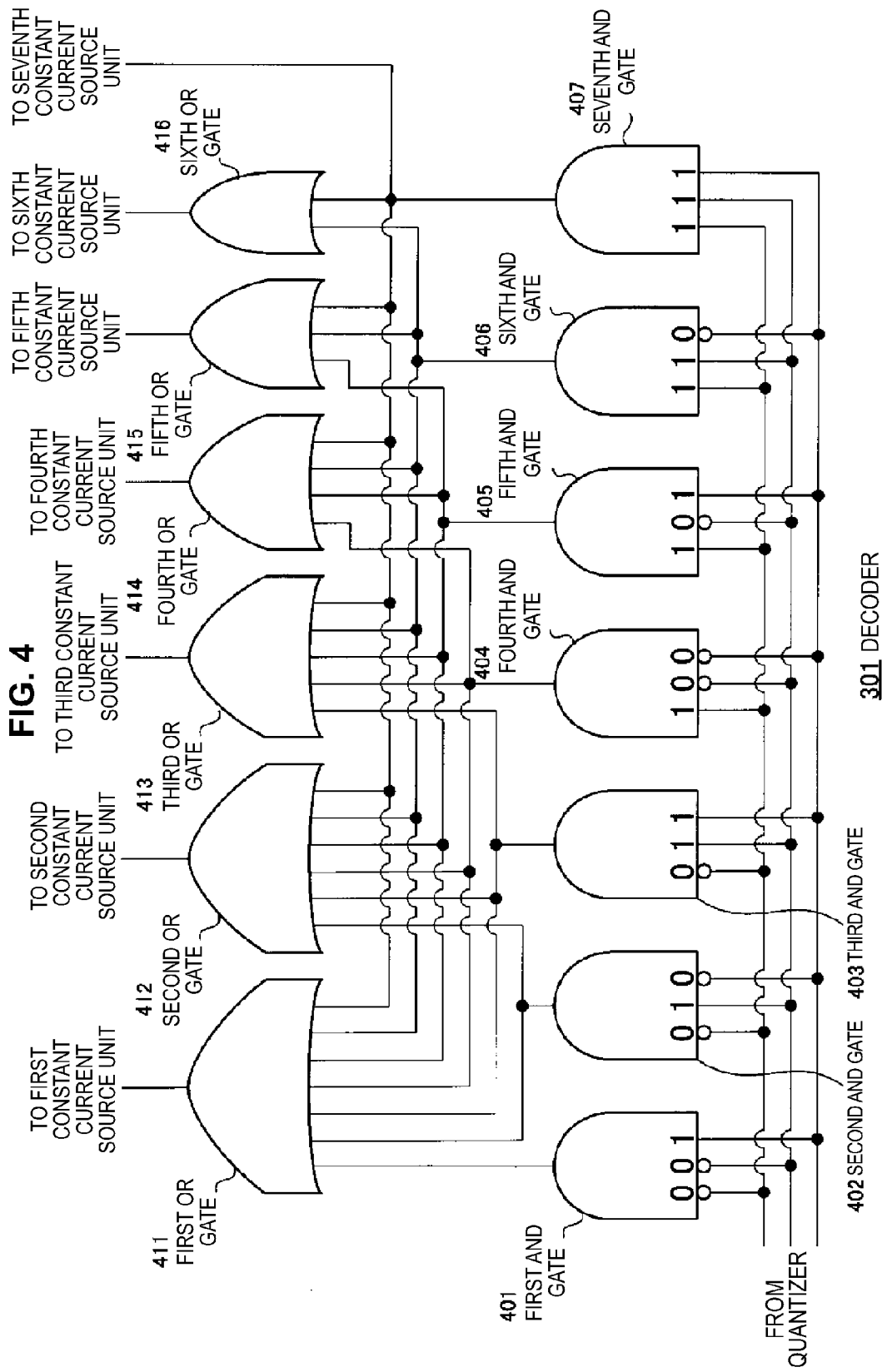
FIG. 4 is a circuit diagram of a decoder.

FIG. 4 is a circuit diagram of the decoder 301.

The decoder 301 includes 7 AND gates and 6 multi-input OR gates.

The input terminal of the AND gate has 3 bits and outputs logical true (high potential) or logical false (low potential) according to the 3-bit signal outputted from the quantizer 202.

In the first AND gate 401, its first bit input terminal and second bit input terminal are inverting input ones, and when "001", that is, the input signal is "1", logical true is outputted.

In the second AND gate 402, its first bit input terminal and third bit input terminal are inverting input ones, and when "010", that is, the input signal is "2", logical true is outputted.

Similarly, the third AND gate 403 outputs logical true when the input signal is "3", the fourth AND gate 404 does when the input signal is "4", the fifth AND gate 405 does when the input signal is "5", the sixth AND gate 406 does when the input signal is "6" and the seventh AND gate 407 does when the input signal is "7".

To the input terminal of the first OR gate 411, the output terminal of the first AND gate 401, the output terminal of the second AND gate 402, the output terminal of the third AND gate 403, the output terminal of the fourth AND gate 404, the output terminal of the fifth AND gate 405, the output terminal of the sixth AND gate 406 and the output terminal of the seventh AND gate 407 are connected. And therefrom, when the input signal is "1" to "7" logical true is outputted and when the input signal is "0" logical false is outputted.

To the input terminal of the second OR gate 412, the output terminal of the second AND gate 402, the output terminal of the third AND gate 403, the output terminal of the fourth AND gate 404, the output terminal of the fifth AND gate 405, the output terminal of the sixth AND gate 406 and the output terminal of the seventh AND gate 407 are connected. And therefrom, when the input signal is "2" to "7" logical true is outputted and when the input signal "0" or "1" logical false is outputted.

To the input terminal of the third OR gate 413, the output terminal of the third AND gate 403, the output terminal of the fourth AND gate 404, the output terminal of the fifth AND gate 405, the output terminal of the sixth AND gate 406 and the output terminal of the seventh AND gate 407 are connected. And therefrom, when the input signal is "3" to "7" logical true is outputted and when the input signal is "0", "1" or "2" logical false is outputted.

To the input terminal of the fourth OR gate 414, the output terminal of the fourth AND gate 404, the output terminal of the fifth AND gate 405, the output terminal of the sixth AND gate 406 and the output terminal of the seventh AND gate 407 are connected. And therefrom, when the input signal is "4" to "7" logical true is outputted and when the input signal is "0", "1", "2" or "3" logical false is outputted.

To the input terminal of the fifth OR gate 415, the output terminal of the fifth AND gate 405, the output terminal of the sixth AND gate 406 and the output terminal of the seventh AND gate 407 are connected. And therefrom, when the input signal is "5" to "7" logical true is outputted and when the input signal is "0", "1", "2", "3" or "4" logical false is outputted.

To the input terminal of the sixth OR gate 416, the output terminal of the sixth AND gate 406 and the output terminal of the seventh AND gate 407 are connected. And therefrom, when the input signal is "6" or "7" logical true is outputted and when the input signal is "0", "1", "2", "3", "4" or "5" logical false is outputted.

The first OR gate 411 controls the first constant current source unit 302. Similarly, the second OR gate 412 controls the second constant current source unit 303, the third OR gate 413 controls the third constant current source unit 304, the fourth OR gate 414 controls the fourth constant current source unit 305, the fifth OR gate 415 controls the fifth constant current source unit 306 and the sixth OR gate 416 controls the sixth constant current source unit 307. Furthermore, the seventh AND gate 407 controls the seventh constant current source unit 308.

Now, focusing on the first constant current source unit 302, when the 3-bit input signal is "0", the first AND gate 401 to the seventh AND gate 407 all output logical false. Accordingly, the first OR gate 411 outputs logical false, and thus, the first transistor switch 310 of the first constant current source unit 302 is turned OFF and the second transistor switch 311 thereof is turned ON. Due to this, to the resistor R241 connected to the negative side output terminal of the fourth amplifier 224, the drain of the MOS-FET which is a constant current source is connected. In other words, between the resistor R241 connected to the negative side output terminal of the fourth amplifier 224 and the ground, a resistor allowing a predetermined current to flow is connected. Accordingly, part of a current flowing out from the resistor R241 connected to the negative side output terminal of the fourth amplifier 224 flows out to the ground, this reducing a current flowing into the negative side input terminal of the quantizer 202 downstream. Such reduction of the current from the negative side output terminal leads to supply of a positive signal as a whole. The IDAC 203 is a negative feedback element, supplying negative of negative one, that is, positive one.

Conversely, when the 3-bit input signal is "1", the first AND gate 401 outputs logical true. Accordingly, the first OR gate 411 outputs logical true, and thus, the first transistor switch 310 of the first constant current source unit 302 is turned ON and the second transistor switch 311 thereof is turned OFF. Due to this, to the positive side output terminal of the fourth amplifier 224, the drain of the MOS-FET which is a constant current source is connected. In other words, between the positive side output terminal of the fourth amplifier 224 and the ground, a resistor allowing a predetermined current to flow is connected. Accordingly, part of a current flowing out from the positive side output terminal of the fourth amplifier 224 flows out to the ground, this reducing a current flowing into the positive side input terminal of the quantizer 202 downstream. Such reduction of the current from the positive side output terminal leads to supply of a negative signal as a whole. The IDAC 203 is a negative feedback element, supplying negative of positive one, that is, negative one.

Supposed that the MOS-FET 309 configuring a constant current source takes value "1", the first constant current source unit 302 to the seventh constant current source unit 308 each takes value "+1" or "−1" according to the status of the transistor switches.

When the 3-bit input signal is "0", the first constant current source unit 302 to the seventh constant current source unit 308 all are given logical false, this leading to output of "−7".

When the 3-bit input signal is "1", only the first constant current source unit 302 is given logical true and the second constant current source unit 303 to the seventh constant current source unit 308 are given logical false, this leading to output of "−5".

Similarly, when the 3-bit input signal is "2", "−3" is outputted, when the 3-bit input signal is "3", "−1" is, when the 3-bit input signal is "4", "1" is, when the 3-bit input signal is "5", "3" is, when the 3-bit input signal is "6", "5" is, and when the 3-bit input signal is "7", "7" is.

[Design of ΔΣ A/D Converter 201]

Details for conception of the ΔΣ A/D converter 201 according to the embodiment are described.

Figure 5:
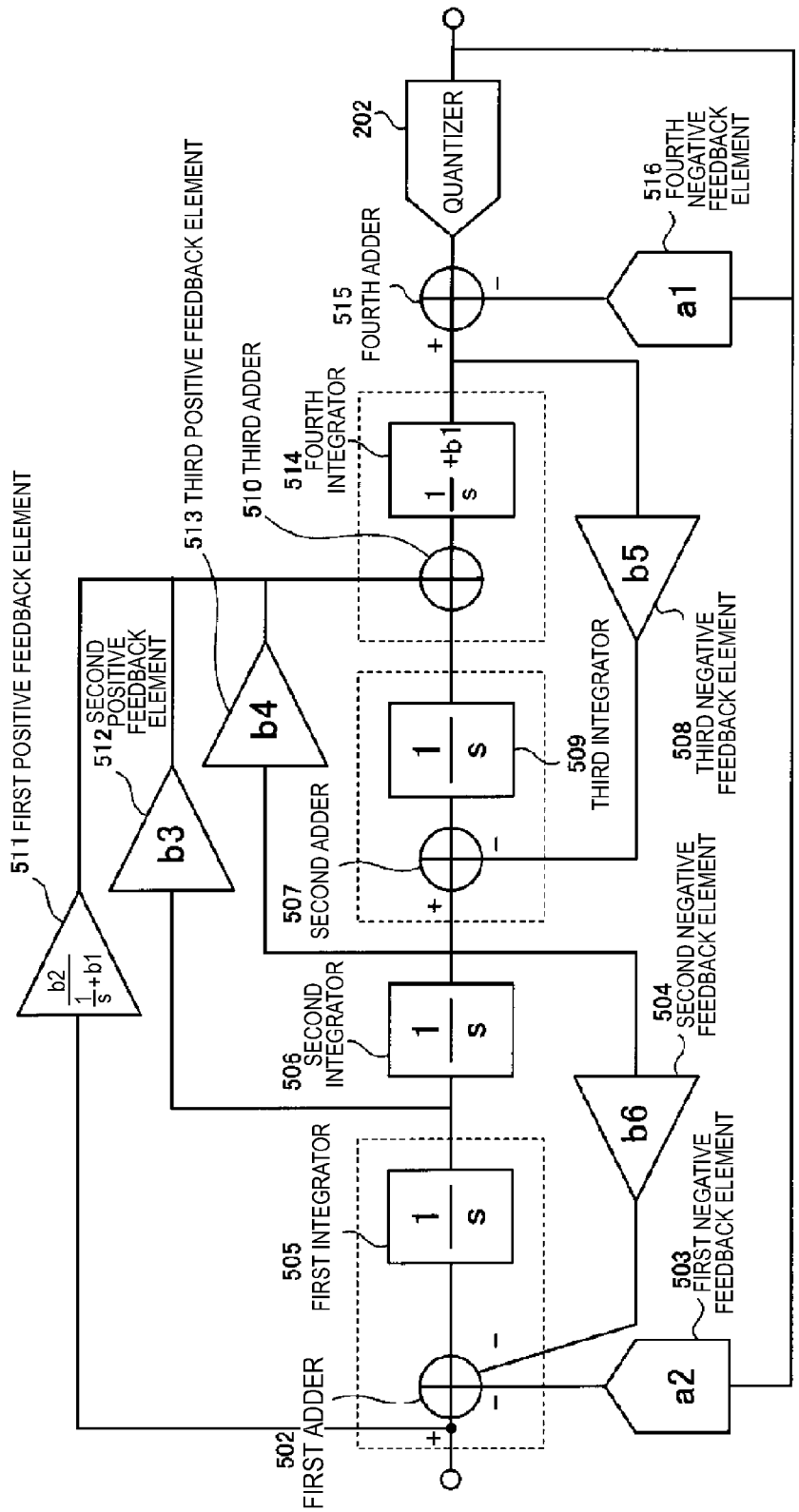
FIG. 5 is a block diagram of a ΔΣ A/D converter.

FIG. 5 is a block diagram of a ΔΣ A/D converter.

First, the inventors have designed a ΔΣ A/D converter 501 based on a block diagram model illustrated in FIG. 5 in consideration of Patent Literature 1.

To the input of a first adder 502, an input signal, a first negative feedback element 503 with an amplification ratio a2 to the output signal of the quantizer 202 and a second negative feedback element 504 with an amplification ratio b6 to the output signal of a second integrator 506 are connected.

To the output of the first adder 502, a first integrator 505 is connected.

To the output of the first integrator 505, the second integrator 506 is connected.

To the output of the second integrator 506, a second adder 507 is connected.

To the input of the second adder 507, the output signal of the second integrator 506 and a third negative feedback element 508 with an amplification ratio b5 to the output signal of the quantizer 202 are connected.

To the output of the second adder 507, a third integrator 509 is connected.

To the output of the third integrator 509, a third adder 510 is connected.

To the input of the third adder 510, as well as the output signal of the third integrator 509, a first positive feedback element 511 with an amplification ratio b2 to a differential of the output of the first adder 502, a second positive feedback element 512 with an amplification ratio b3 to the output of the first adder and a third positive feedback element 513 with an amplification ratio b4 to the output of the second adder 507 are connected.

To the output of the third adder 510, a fourth integrator 514 is connected.

To the output of the fourth integrator 514, a fourth adder 515 is connected.

To the input of the fourth adder 515, as well as the output of the fourth integrator 514, a fourth negative feedback element 516 with an amplification ratio a1 to the output signal of the quantizer 202 is connected To the output of the fourth adder 515, the quantizer 202 is connected. The output of the quantizer 202 affords the output signal of the ΔΣ A/D converter 501.

As is well known, when an integrator is immediately downstream of an adder, they can be integrated into one operational amplifier.

Meanwhile, when no integrator is immediately downstream of the adder, the adder should be configured of an operational amplifier.

In case of the block diagram model illustrated in FIG. 5, five operational amplifiers should be prepared. In other words, one operational amplifier should be independently prepared for the fourth adder 515.

Hence, in order to reduce the number of operational amplifiers, the inventors have come up with a measure of omitting the fourth adder 515 from the block diagram model in FIG. 5.

Figure 6:
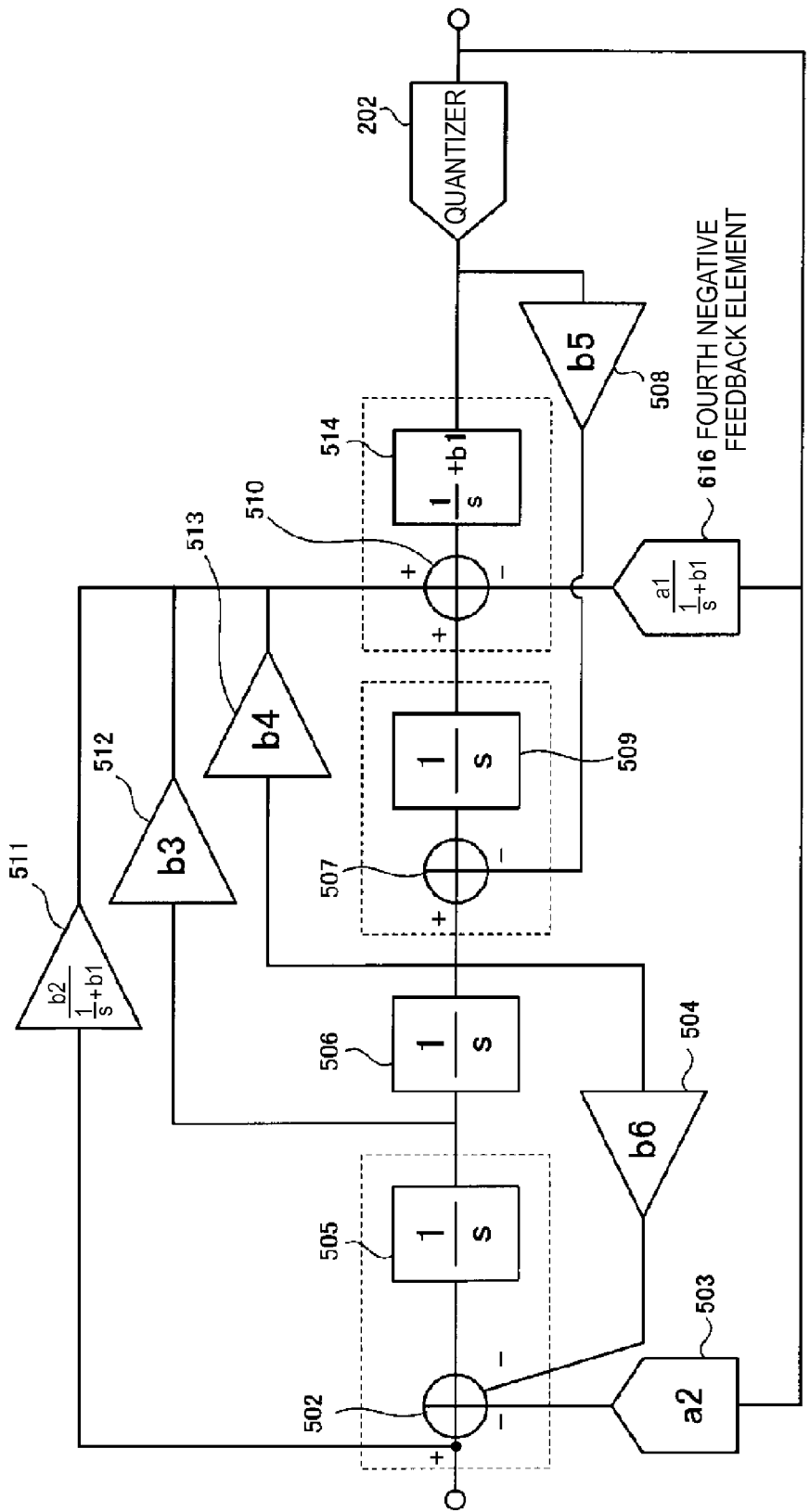
FIG. 6 is a block diagram of a ΔΣ A/D converter.

FIG. 6 is a block diagram of a ΔΣ A/D converter.

Difference from the block diagram model in FIG. 5 is addition of a derivative element to the fourth negative feedback element 516 with the amplification ratio a1 (fourth negative feedback element 616) besides omission of the fourth adder 515.

The fourth negative feedback element 616 includes the fourth negative feedback element 516 to which a derivative element is added, and thereby, the signal to be supplied to the immediate downstream of the fourth integrator 514 is shifted to the upstream of the fourth integrator 514.

Employing this block diagram model enables the number of operational amplifier to be suppressed down to four.

Figure 7:
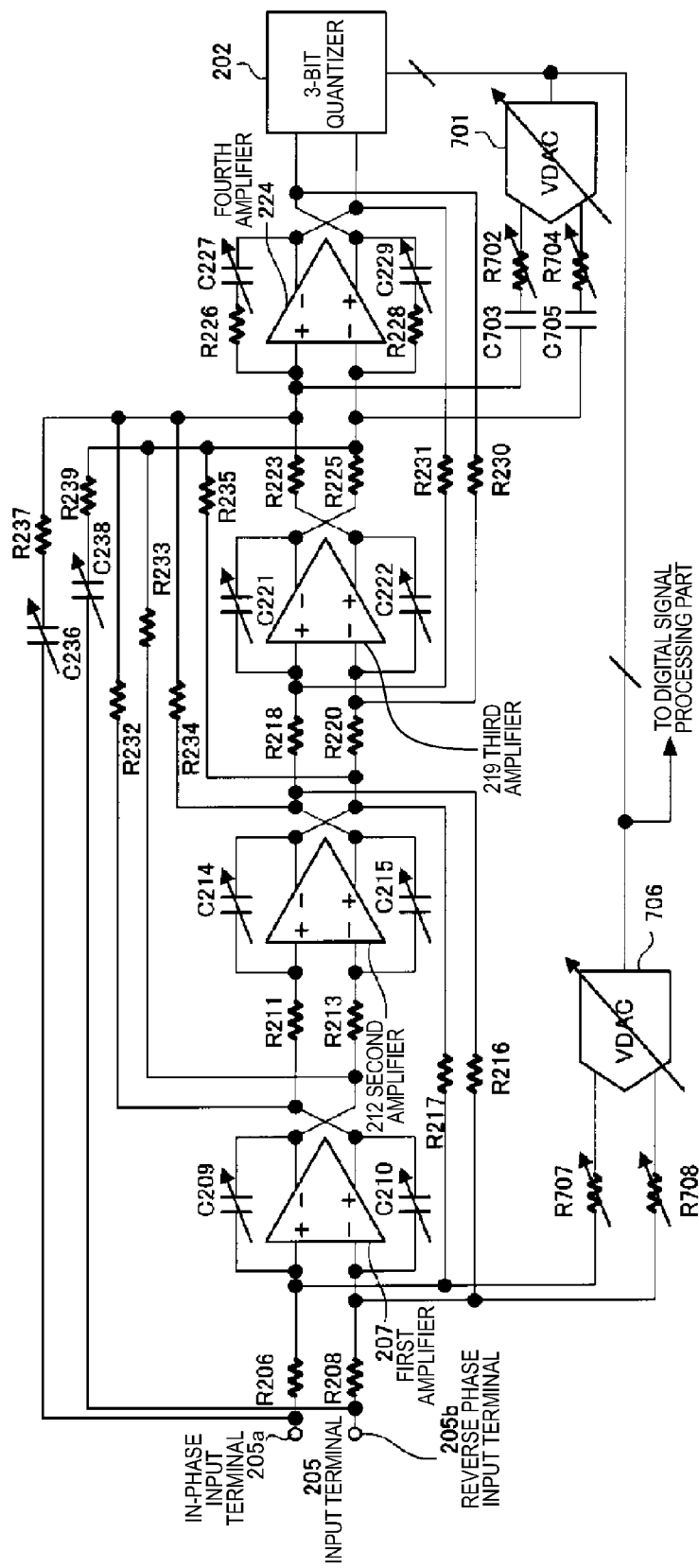
FIG. 7 is a circuit diagram of a ΔΣ A/D converter.

FIG. 7 is a circuit diagram of the ΔΣ A/D converter 601 and is a diagram obtained by rewriting the block diagram model in FIG. 6 as an actual circuit. Difference from the circuit diagram according to the embodiment in FIG. 2 is usage of voltage D/A converters (hereinafter each abbreviated as "VDAC") in place of the IDACs.

The digital signal having undergone 3-bit quantization by the quantizer 202 is inputted to a VDAC 701.

The positive side output signal line of the VDAC 701 is connected to the positive side input terminal of the fourth amplifier 224 via a variable resistor R702 and a capacitor C703 which is a derivative element.

The negative side output signal line of the VDAC 701 is connected to the negative side input terminal of the fourth amplifier 224 via a variable resistor R704 and a capacitor C705 which is a derivative element.

The digital signal having undergone 3-bit quantization is also inputted to a VDAC 706.

The positive side output signal line of the VDAC 706 is connected to the positive side input terminal of the first amplifier 207 via a variable resistor R707.

The negative side output signal line of the VDAC 706 is connected to the negative side input terminal of the first amplifier 207 via a variable resistor R708.

However, employing the block diagram model in FIG. 6 appears to cause a problem.

Figure 8:
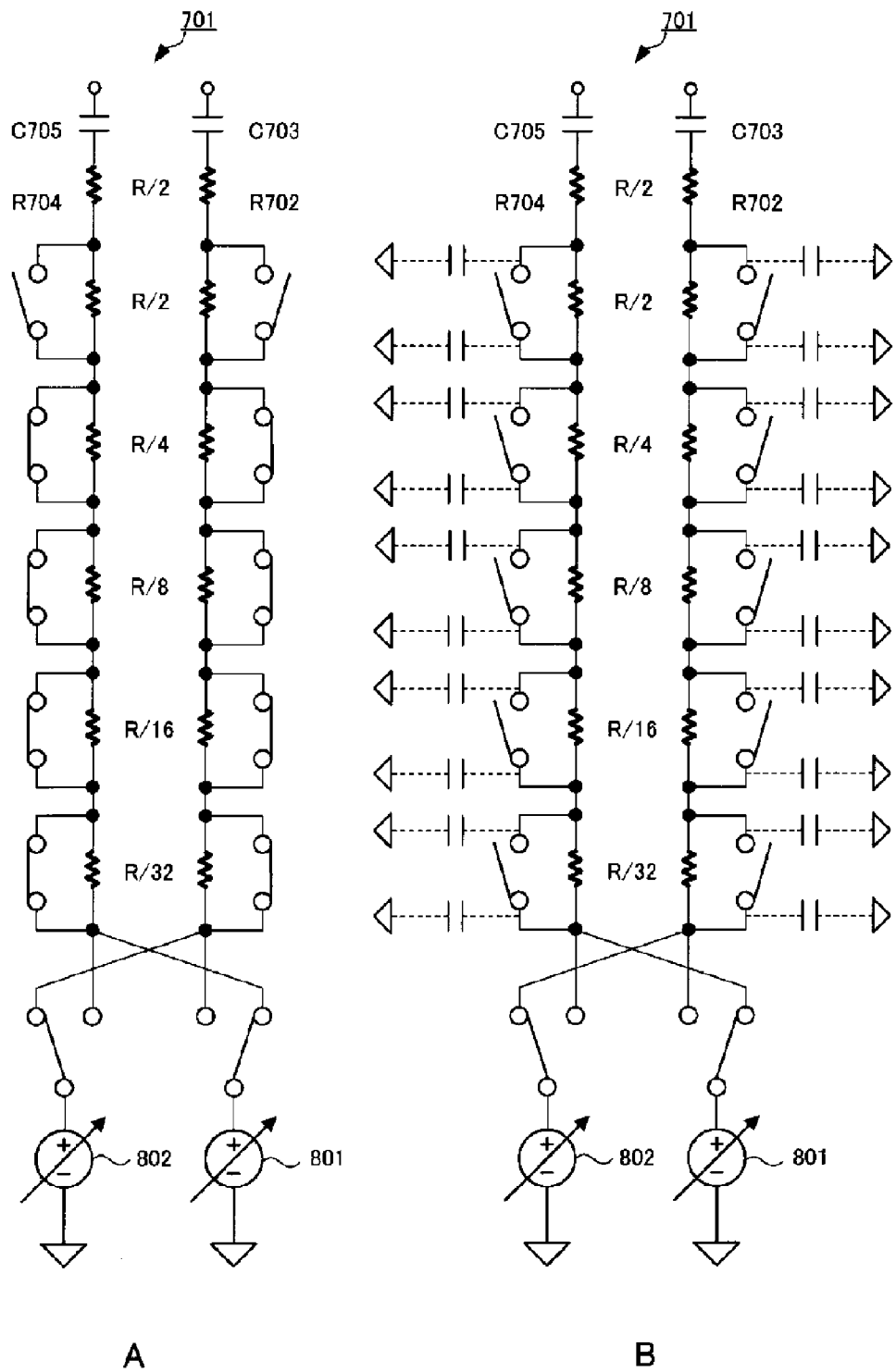
FIGS. 8A and 8B are diagrams illustrating circuit configurations in which capacitors are connected in series to VDACs.

FIGS. 8A and 8B are diagrams illustrating circuit configurations in which capacitors are connected in series to the VDAC 701.

The capacitors C703 and C705 are connected to the output terminals of the VDAC 701, causing increased impedance. Then, parasitic capacitance present in the variable resistors R702 and R704 connected in series becomes apparent. When all the transistor switches connected in parallel to the variable resistors R702 and R704 are controlled to be OFF, the apparent parasitic capacitance results in high frequency characteristics deteriorating and the waveform being dull.

Moreover, when implementing the VDAC, reference voltage sources 801 and 802 should be calibrated. Therefore, the implementation expects a circuit for the calibration independently, this causing a large-scale circuitry.

Hence, the inventors have been considering the meaning of feedback signals applied to signal lines, being apart from the normal technical sense of using adders. As a result, a signal flowing in an object without being high-impedance input has been found to be formed based on the measurement of the current.

An adder in a feedback loop plays a role of subtracting the feedback signal from the main signal. In that case, a constant current source subtracting the current is sufficient for implementation in place of the adder.

Eventually, the inventors have come up with the conception that grounded constant current sources are alternately connected to an in-phase signal line and a reverse phase signal line for the differential analog signal, respectively.

In particular, the IDAC connected immediately upstream of the quantizer enables the adder normally expected for the VDAC to be omitted, this exceedingly contributing improvement of C/N characteristics of the ΔΣ A/D converter and a large dynamic range.

In addition, the resistor R240 connected to the positive side output terminal of the fourth amplifier 224, the resistor R241 connected to the negative side output terminal of the fourth amplifier 224 and the resistor R314 employ the same kind of resistor to improve matching, this automatically enabling to absorb unevenness between the resistors. Therefore, the complicated calibration function for FIGS. 8A and 8B can be omitted.

Figure 9:
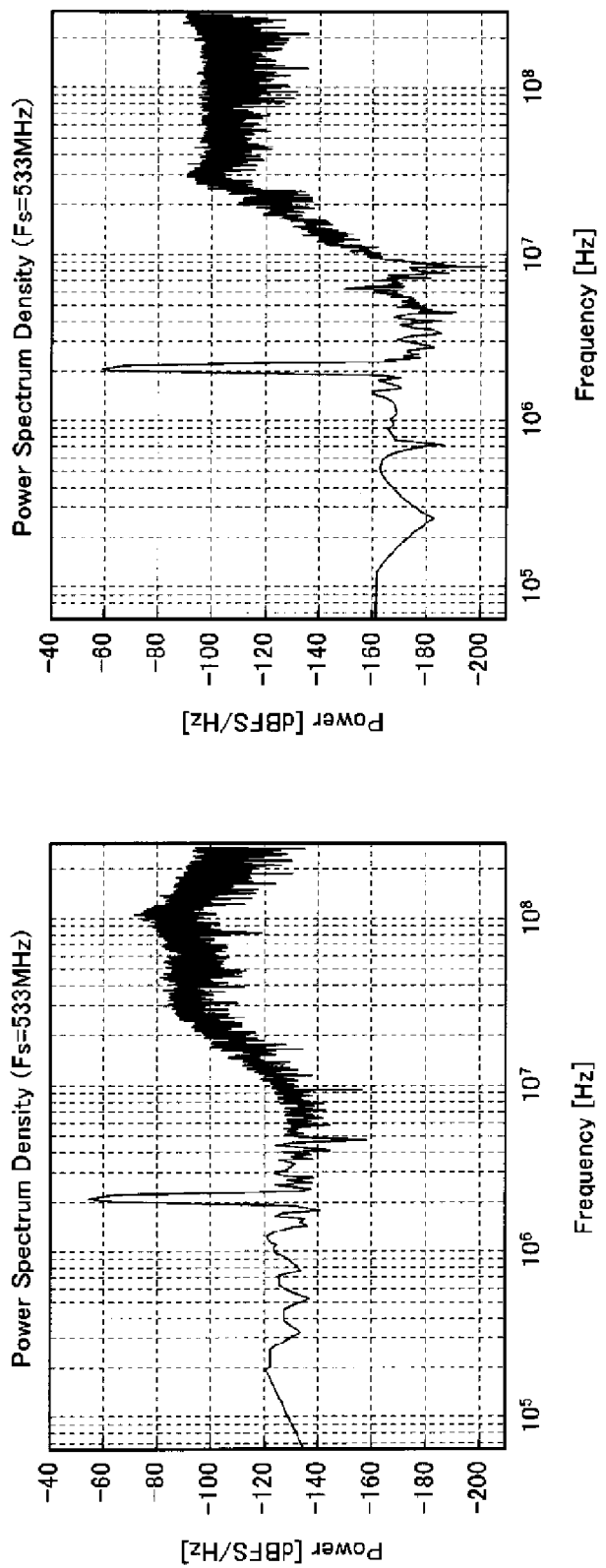
FIGS. 9A and 9B are graphs illustrating simulation results of frequency characteristics of a ΔΣ A/D converter according to an existing technology and the ΔΣ A/D converter according to the embodiment.
Figure 10:
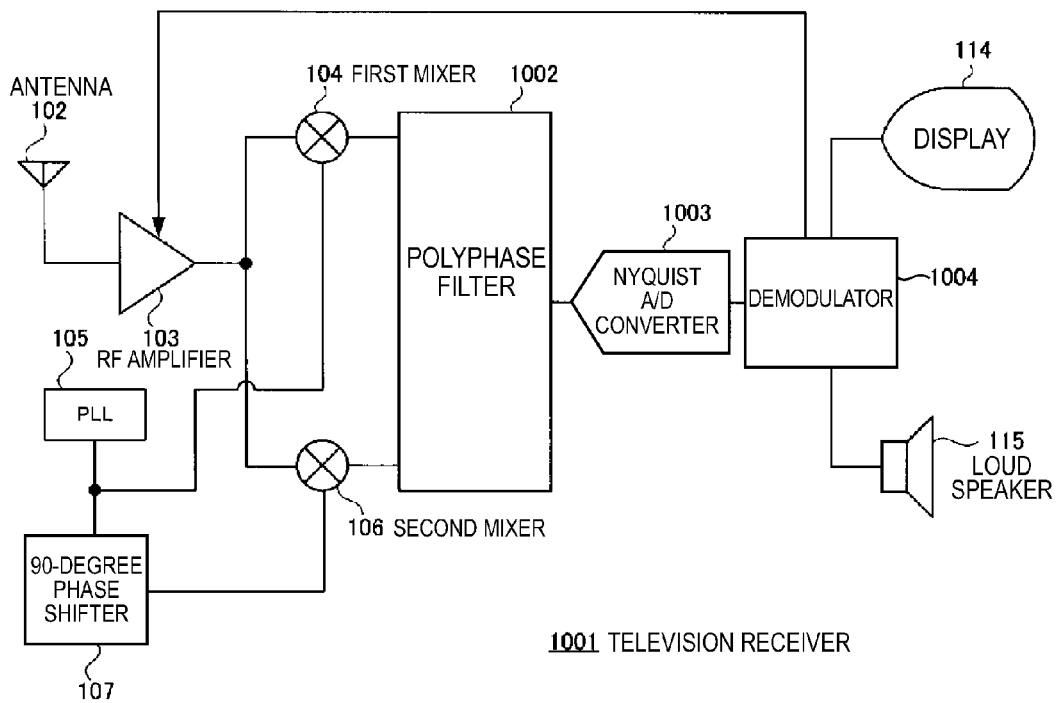
FIG. 10 is a block diagram of a television receiver according to an existing technology.

FIGS. 9A and 9B are graphs illustrating simulation results of frequency characteristics for the ΔΣ A/D converter according to the existing technology and the ΔΣ A/D converter according to the embodiment.

In case of the ΔΣ A/D converter using the VDACs in FIG. 9A, a difference of approximately 60 dB is between a desired signal frequency Fs and other frequencies. However, unevenness between the circuitry elements does not allow such a dynamic range easily. Furthermore, addition of the influence of the parasitic capacitance further deteriorates the dynamic range.

In case of the ΔΣ A/D converter using the IDACs in FIG. 9A, a difference of approximately 100 dB is between the desired signal frequency Fs and other frequencies. In other words, the dynamic range up to 100 dB can be attained ideally. Therefore, the margin is found to be sufficient for attaining the dynamic range up to 60 dB without difficulty even in consideration of unevenness between the circuitry elements and the like.

The ΔΣ A/D converter 201 can be provided for realizing omission of the fourth adder 515 in implementing the block diagram model in FIG. 5 and excellent dynamic range and C/N ratio by employing the IDAC 203 and IDAC 204 illustrated in FIG. 3 and FIG. 4. In other words, the ΔΣ A/D converter 201 in FIG. 2 is the resultant of implementation of the ΔΣ A/D converter 501 illustrated in the block diagram model of FIG. 5 using the IDAC 203 and IDAC 204.

The embodiment described above can be applied to examples as follows.

(1) Since the above-mentioned ΔΣ A/D converter 201 is a highly general-purpose circuit, the ΔΣ A/D converter 201 according to the embodiment can be applied to all kinds of electronic equipment employing a ΔΣ A/D converter. The application range can include, for example, portable wireless terminals, audio devices, various control devices, and the like as various application targets, as well as television receivers.

(2) The output signal of the quantizer 202 can be configured in a known thermometer form, this omitting the decoder 301. In this case, the quantizer 202 includes 7 output signal lines, and to the individual output signal line, the first constant current source unit 302, second constant current source unit 303, third constant current source unit 304, fourth constant current source unit 305, fifth constant current source unit 306, sixth constant current source unit 307 and seventh constant current source unit 308 are directly connected, respectively.

(3) The present technology may also be configured as below.

<1> A delta-sigma A/D converter including:
a first integrator;
a second integrator located on an output side of the first integrator;
a quantizer located on an output side of the second integrator; and
a first current D/A converter receiving an output of the quantizer and providing a negative feedback signal to an input side of the quantizer.

<2> The delta-sigma A/D converter according to <1>, further including
a second current D/A converter receiving the output of the quantizer and providing a negative feedback signal to an input side of the first integrator.

<3> The delta-sigma A/D converter according to <1> or <2>,
wherein a differential analog signal is inputted to the first integrator, the second integrator and the quantizer, and
wherein the first current D/A converter includes a plurality of current source units each including a first current source connected between an in-phase signal line for the differential analog signal and a ground, and a second current source connected between a reverse phase signal line for the differential analog signal and the ground.

<4> A television receiver including:
an RF amplifier amplifying a radio wave received from an antenna;
a local oscillator;
a 90-degree phase shifter performing 90-degree phase shift on a phase of a signal outputted by the local oscillator;
a first mixer connected to the RF amplifier and the local oscillator and outputting an I-channel signal which is an intermediate frequency signal;
a second mixer connected to the RF amplifier and the 90-degree phase shifter and outputting a Q-channel signal which is an intermediate frequency signal;

a first delta-sigma A/D converter including a first integrator, a second integrator located on an output side of the first integrator, a quantizer located on an output side of the second integrator, and a first current D/A converter receiving an output of the quantizer and providing a negative feedback signal to an input side of the quantizer;

a second delta-sigma A/D converter having the same configuration as the first delta-sigma A/D converter; and a digital signal processing part receiving a digital I-channel signal outputted from the first delta-sigma A/D converter and a digital Q-channel signal outputted from the second delta-sigma A/D converter to perform predetermined filter processing and demodulation processing.

<5> The television receiver according to <4>, wherein the first delta-sigma A/D converter further includes a second current D/A converter receiving the output of the quantizer and providing a negative feedback signal to an input side of the first integrator.

<6> The television receiver according to <4> or <5>, wherein, as to the first delta-sigma A/D converter, a differential analog signal is inputted to the first integrator, the second integrator and the quantizer, and wherein the first current D/A converter includes a plurality of current source units each including a first current source connected between an in-phase signal line for the differential analog signal and a ground, and a second current source connected between a reverse phase signal line for the differential analog signal and the ground.

According to the embodiment, the television receiver 101 and the ΔΣ A/D converter 201 used for the same have been disclosed.

In the feedback loops, the IDACs are used each of which has a configuration in which the grounded constant current source is alternately connected to the in-phase signal line and reverse phase signal line for the differential analog signal. Using such an IDAC enables to realize a feedback loop without an adder. In particular, the IDAC connected immediately upstream of the quantizer enables an adder normally expected for the VDAC to be omitted, this exceedingly contributing improvement of C/N characteristics of the ΔΣ A/D converter and a large dynamic range.

As apparent from FIG. 1, a first limiter 108 and a second limiter 110 have the same configuration.

The inputted signal (the I-channel signal or Q-channel signal) is compared with a reference voltage of a reference voltage source 118 by a comparator 117. When the voltage of the signal exceeds the reference voltage, the comparator 117 output logical true (high potential). Then, a selector switch 119 switches the output terminal to the side of the reference voltage source 118 according to control of the comparator 117. Accordingly, the voltage outputted via the selector switch 119 does not exceed the reference voltage of the reference voltage source 118.

Fourth Embodiment

Circuit Configuration of Limiter Circuit

The block diagram illustrated in FIG. 1 is only a diagram for explaining a principle and a contrivance for circuitry is expected in implementing a real ΔΣ A/D converter.

Figure 11:
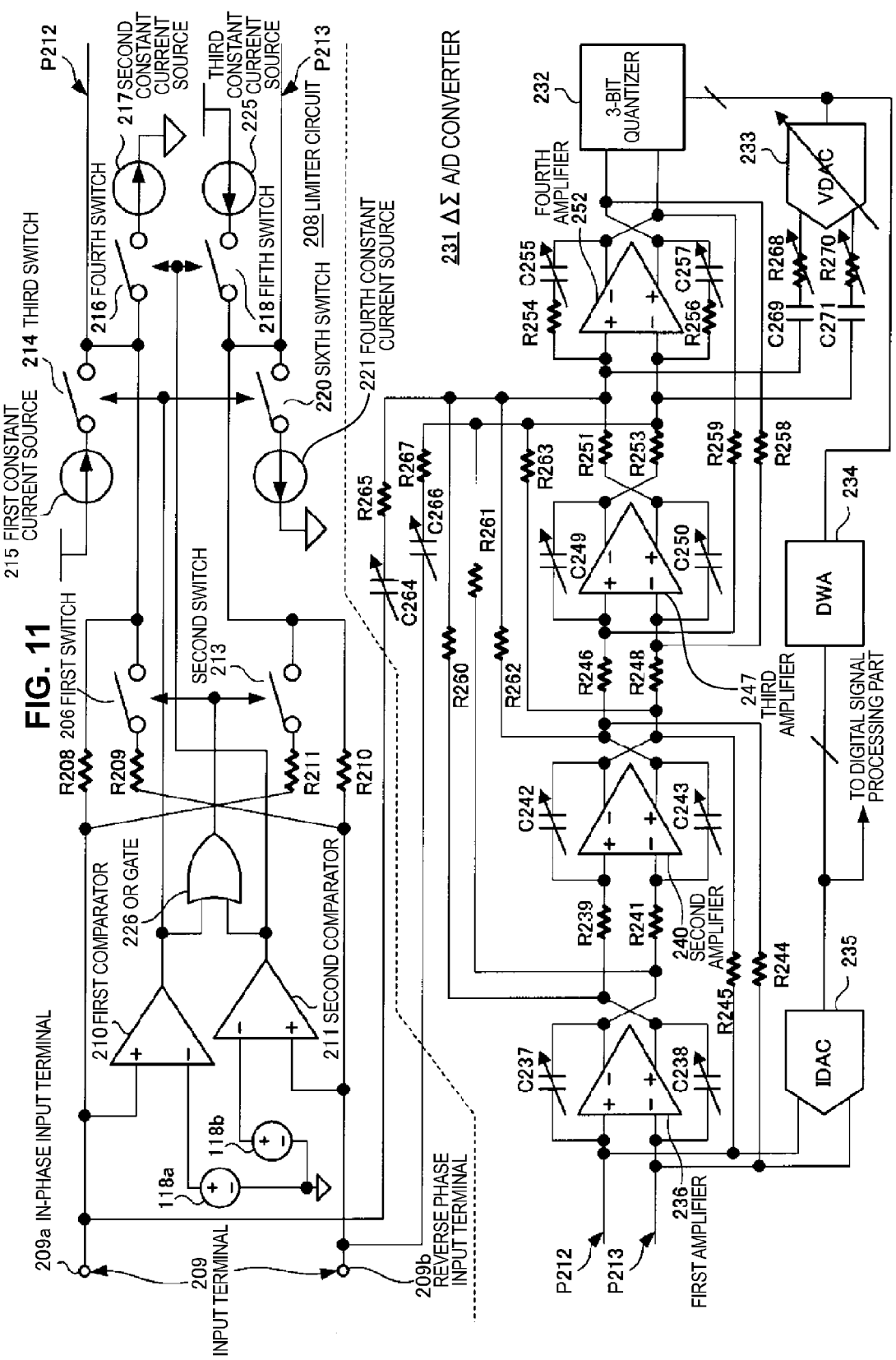
FIG. 11 is a circuit diagram of a limiter circuit and a ΔΣ A/D converter according to a fourth embodiment.

FIG. 11 is a circuit diagram of a limiter circuit and a ΔΣ A/D converter according to a fourth embodiment.

First, a configuration of a limiter circuit 208 is described.

To an in-phase input terminal 209a of an input terminal 209 of the limiter circuit 208 to which terminal an I-channel signal or a Q-channel signal in a form of a differential analog signal (hereinafter abbreviated as "input analog signal") is inputted, the positive side input terminal of a first comparator 210 is connected and an in-phase input signal is inputted. To the negative side input terminal of the first comparator 210, a reference voltage source 118a is connected and the first comparator 210 outputs logical true when a voltage of the input analog signal at the in-phase input terminal 209a exceeds a reference voltage supplied by the reference voltage source 118a.

To the reverse phase input terminal 209b of the input terminal 209, the positive side input terminal of a second comparator 211 is connected and a reverse phase input signal is inputted. To the negative side input terminal of the second comparator 211, a reference voltage source 118b is connected and the second comparator 211 outputs logical true when a voltage of the reverse phase input terminal 209b of the input terminal 202 exceeds a reference voltage supplied by the reference voltage source 118b.

The output signal line of the first comparator 210 and the output signal line of the second comparator 211 are inputted to an OR gate 226. The output of the OR gate 226 controls a first switch 206 and a second switch 213 to be ON or OFF.

To the in-phase input terminal 209a of the input terminal 209, a resistor R208 is connected. To the other end of the resistor R208, a resistor R209 is connected via a first switch 206. The other end of the resistor R209 is connected to the reverse phase input terminal 209b for the input analog signal.

To the reverse phase input terminal 209b of the input terminal 209, a resistor R210 is connected. To the other end of the resistor R210, a resistor R211 is connected via a second switch 213. The other end of the resistor R211 is connected to the in-phase input terminal 209a for the input analog signal.

The resistors R208, R209, R210 and R211 all have the same resistance value.

When the OR gate 226 outputs logical true, the first switch 206 and second switch 213 are turned ON. Then, to the in-phase input terminal 209a and reverse phase input terminal 209b of the input terminal 209, in-series connection of the resistors R208 and R209 and in-series connection of the resistors R210 and R211 are connected in parallel individually.

As described above, since the resistors R208, R209, R210 and R211 all have the same resistance value, a potential difference between a connection node P212 of the resistor R208 and first switch 206 tied to the in-phase input terminal 209a and a connection node P213 of the resistor R210 and second switch 213 tied to the reverse phase input terminal 209b each is equal to the middle point voltage. In other words, they are approximately equal to the ground potential.

Meanwhile, the connection node P212 and connection node P213 are the input terminals of a first amplifier 236. Since they are virtually grounded, their potentials do not change ideally and currents for them do change.

Accordingly, when the voltage of the in-phase input terminal 209a of the input terminal 209 exceeds the reference voltage of the reference voltage source 118a, or when the voltage of the reverse phase input terminal 209b thereof exceeds the reference voltage of the reference voltage source 118b, the first switch 206 and second switch 213 are controlled to be ON, this causing the currents flowing into the connection node P212 and connection node P213 to be 0 steeply.

Once the current flowing into the first amplifier 236 becomes 0, the input voltage signal seen from the input terminal 209 is regarded as if 0. This phenomenon gives large distortion on the signal, being significantly unfavorable. Therefore, the potentials of the connection node P212 and connection node P213 are increased or decreased to the allowable voltage of a ΔΣ A/D converter 231. Note that the input terminal 209 of the ΔΣ A/D converter 231 is for current input. Hence, constant current sources are connected thereto in spite of the reference voltage sources 118a and 118b connected as they are.

To the connection node P212, a first constant current source 215 via a third switch 214 and a second constant current source 217 via a fourth switch 216 are connected.

To the connection node P213, a third constant current source 225 via a fifth switch 218 and a fourth constant current source 221 via a sixth switch 220 are connected.

The first constant current source 215 and third constant current source 225 allow a certain current to flow in from the power supply.

The second constant current source 217 and fourth constant current source 221 allow a certain current to flow out to the ground.

Fourth Embodiment

Operation of Limiter Circuit 208

Hereafter, operation of the limiter circuit 208 is described with reference to the drawings.

Figure 12:
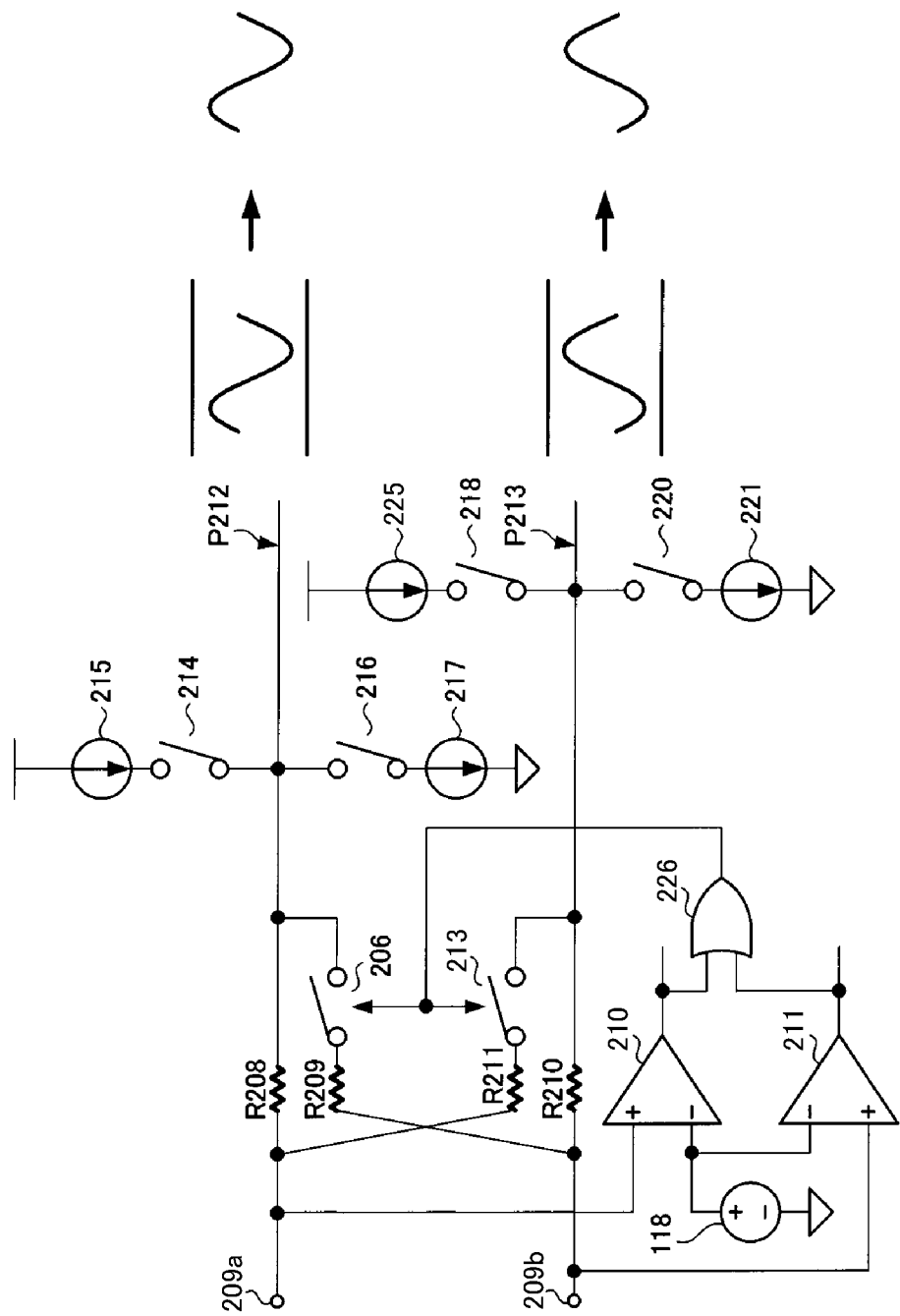
FIG. 12 is a schematic diagram illustrating operation of the limiter circuit when peak voltages of the input terminal each do not exceed a reference voltage.

FIG. 12 is a schematic diagram illustrating operation of the limiter circuit 208 when peak voltages of the input terminal 209 each does not exceed the reference voltage.

When no excess over the reference voltage takes place at each of the in-phase input terminal 209a and reverse phase input terminal 209b of the input terminal 209, as illustrated in FIG. 12, the first switch 206, second switch 213, third switch 214, fourth switch 216, fifth switch 218 and sixth switch 220 all are turned OFF. The potentials of the in-phase input terminal 209a and reverse phase input terminal 209b are inputted to P212 and P213 as the input terminals of the ΔΣ A/D converter 231 as they are.

Figure 13:
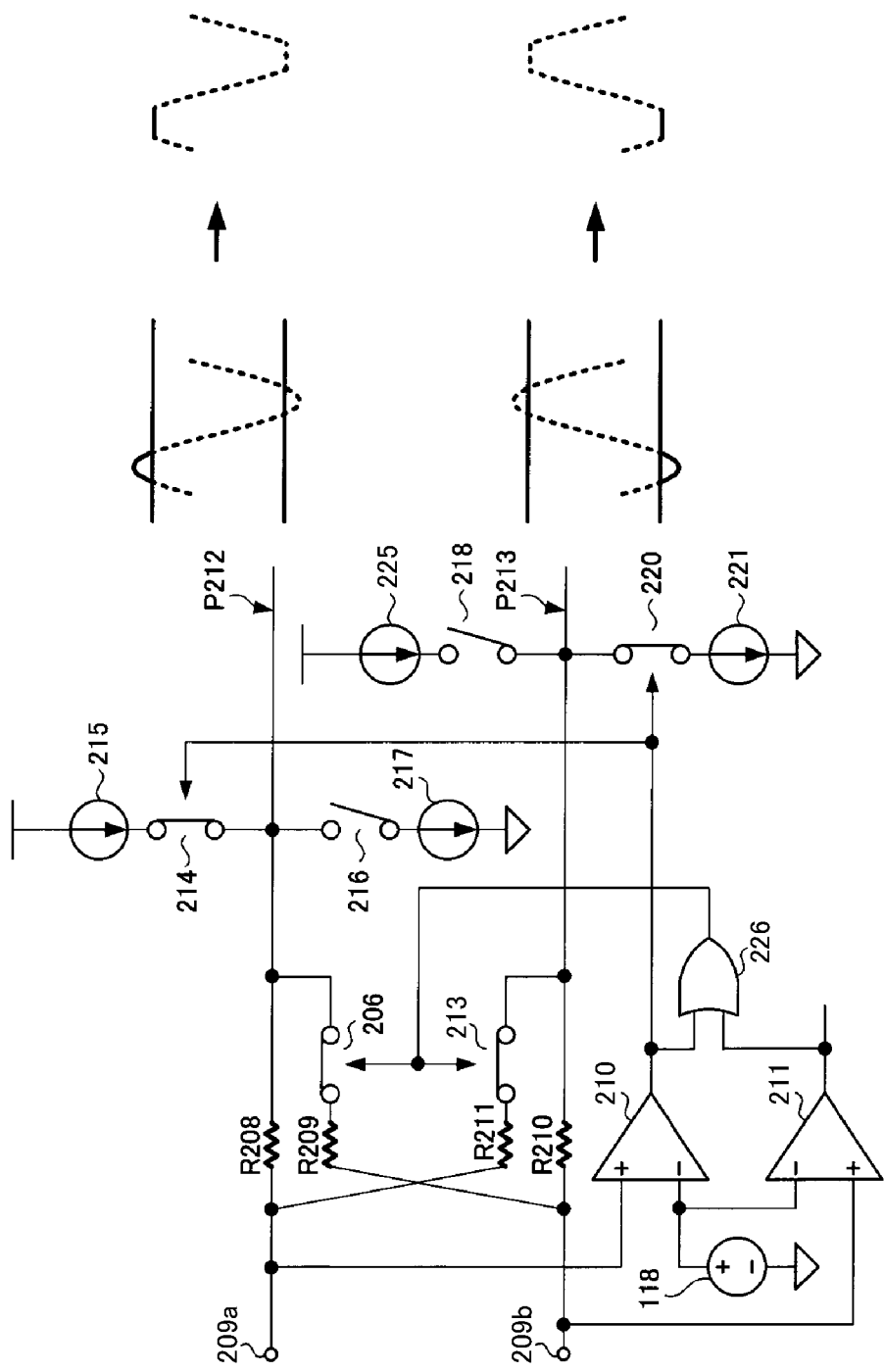
FIG. 13 is a schematic diagram illustrating operation of the limiter circuit when a peak voltage of a hot side line of the input terminal exceeds the reference voltage.

FIG. 13 is a schematic diagram illustrating operation of the limiter circuit 208 when the peak voltage of the in-phase input terminal 209a of the input terminal 209 exceeds the reference voltage.

When excess over the reference voltage takes place at the in-phase input terminal 209a of the input terminal 209, the first comparator 210 outputs logical true. Then, the OR gate 226 outputs logical true, causing the first switch 206 and second switch 213 to be controlled individually to be ON.

Then, since the first comparator 210 controls the third switch 214 and sixth switch 220 to be ON, to the connection node P212, the first constant current source 215 is connected, and to the connection node P213, the fourth constant current source 221 is. Due to this, the connection node P212 is maintained to be at the positive side allowable voltage of the ΔΣ A/D converter 231, and the connection node P213 is to be at the negative side allowable voltage of the ΔΣ A/D converter 231.

Figure 14:
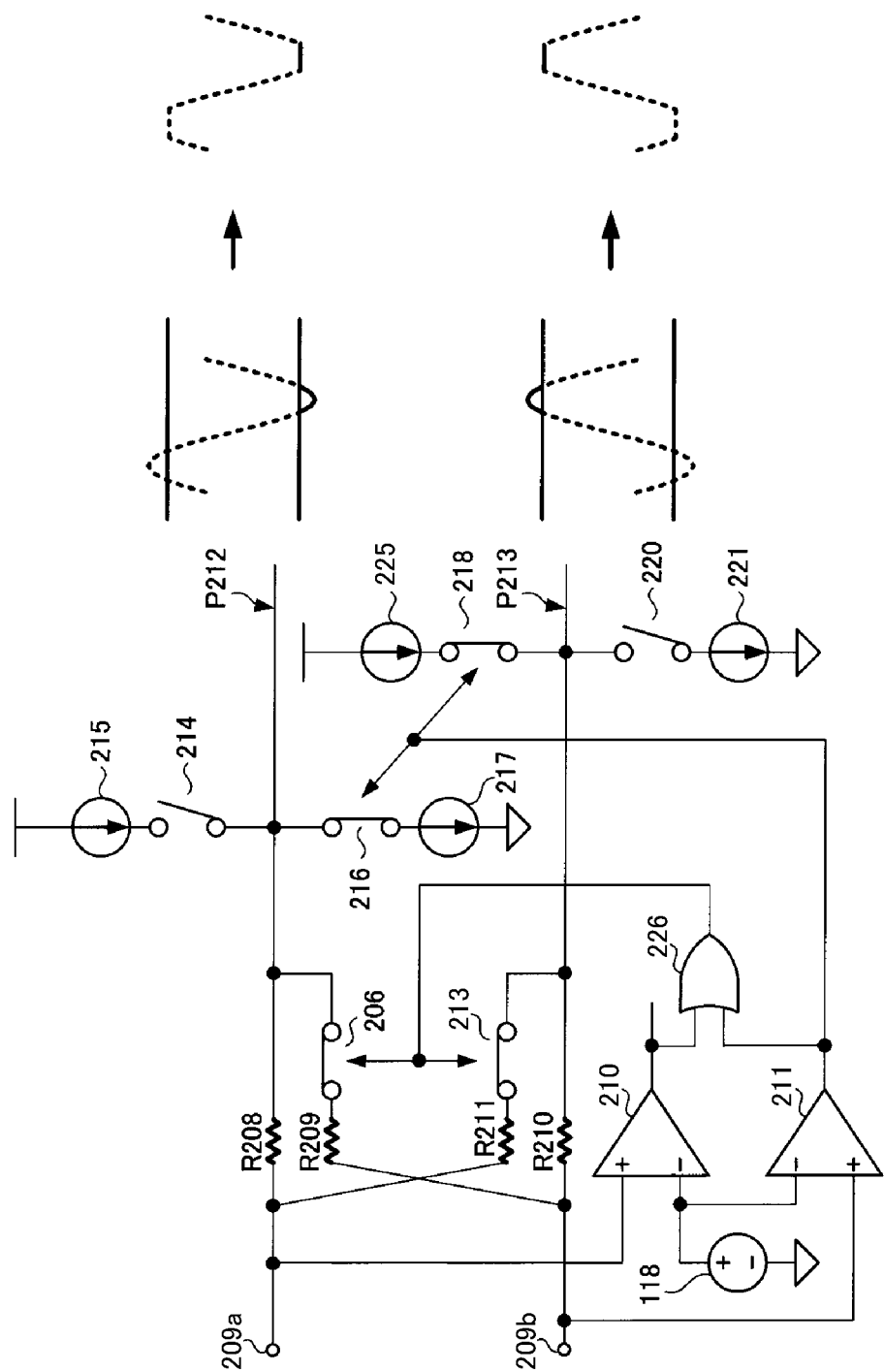
FIG. 14 is a schematic diagram illustrating operation of the limiter circuit when a peak voltage of a cold side line of the input terminal exceeds the reference voltage.

FIG. 14 is a schematic diagram illustrating operation of the limiter circuit 208 when the peak voltage of the reverse phase input terminal 209b of the input terminal 209 exceeds the reference voltage.

When excess over the reference voltage takes place at the reverse phase input terminal 209b of the input terminal 209, the second comparator 211 outputs logical true. Then, the OR gate 226 outputs logical true, causing the first switch 206 and second switch 213 to be controlled individually to be ON.

Then, since the second comparator 211 controls the fourth switch 216 and fifth switch 218 to be ON, to the connection node P212, the second constant current source 217 is connected, and to the connection node P213, the third constant current source 225 is. Due to this, the connection node P212 is maintained to be at the negative side allowable voltage of the ΔΣ A/D converter 231, and the connection node P213 is to be the positive side allowable voltage of the ΔΣ A/D converter 231.

Fourth Embodiment

Circuit Configuration of ΔΣ A/D Converter 231

Returning to FIG. 11 again, the ΔΣ A/D converter 231 is described briefly.

The ΔΣ A/D converter 231 includes four integrators configured of fully-differential amplifiers, a 3-bit quantizer 232, a voltage D/A converter (hereinafter abbreviated as "VDAC") 233, a linearity improving part (Data-Weighted Averaging: hereinafter abbreviated as "DWA") 234 and a current D/A converter (hereinafter abbreviated as "IDAC") 235.

A variable capacitor C237 is connected between the positive side input terminal and negative side output terminal of the first amplifier 236.

A variable capacitor C238 is connected between the negative side input terminal and positive side output terminal of the first amplifier 236. The connection node P212 is connected to the positive side input terminal of the first amplifier 236. The connection node P213 is connected to the negative side input terminal of the first amplifier 236. The first amplifier 236 is also a current-voltage converter in order to convert a weak current into a voltage signal as well as an integrator.

To the positive side output terminal of the first amplifier 236, the positive side input terminal of the second amplifier 240 is connected via a resistor R239.

To the negative side output terminal of the first amplifier 236, the negative side input terminal of the second amplifier 240 is connected via a resistor R241.

A variable capacitor C242 is connected between the positive side input terminal and negative side output terminal of the second amplifier 240.

A variable capacitor C243 is connected between the negative side input terminal and positive side output terminal of the second amplifier 240.

Accordingly, the second amplifier 240 functions as an integrator.

A resistor R244 is connected as a feedback control line between the positive side output terminal of the second amplifier 240 and the negative side input terminal of the first amplifier 236.

A resistor R245 is connected as a feedback control line between the negative side output terminal of the second amplifier 240 and the positive side input terminal of the first amplifier 236.

To the positive side output terminal of the second amplifier 240, the positive side input terminal of a third amplifier 247 is connected via a resistor R246.

To the negative side output terminal of the second amplifier 240, the negative side input terminal of the third amplifier 247 is connected via a resistor R248.

A variable capacitor C249 is connected between the positive side input terminal and negative side output terminal of the third amplifier 247.

A variable capacitor C250 is connected between the negative side input terminal and positive side output terminal of the third amplifier 247.

Accordingly, the third amplifier 247 functions as an integrator.

To the positive side output terminal of the third amplifier 247, the positive side input terminal of a fourth amplifier 252 is connected via a resistor R251.

To the negative side output terminal of third amplifier 247, the negative side input terminal of the fourth amplifier 252 is connected via a resistor R253.

A resistor R254 and a variable capacitor C255 are connected in series between the positive side input terminal and negative side output terminal of the fourth amplifier 252.

A resistor R256 and a variable capacitor C257 are connected in series between the negative side input terminal and positive side output terminal of the fourth amplifier 252.

Accordingly, the fourth amplifier 252 functions as an integrator.

A resistor R258 is connected as a feedback control line between the positive side output terminal of the fourth amplifier 252 and the negative side input terminal of the third amplifier 247.

A resistor R259 is connected as a feedback control line between the negative side output terminal of the fourth amplifier 252 and the positive side input terminal of the third amplifier 247.

A resistor R260 is connected as a feedforward control line between the positive side output terminal of the first amplifier 236 and the positive side input terminal of the fourth amplifier 252.

A resistor R261 is connected as a feedforward control line between the negative side output terminal of the first amplifier 236 and the negative side input terminal of the fourth amplifier 252.

A resistor R262 is connected as a feedforward control line between the positive side output terminal of the second amplifier 240 and the positive side input terminal of the fourth amplifier 252.

A resistor R263 is connected as a feedforward control line between the negative side output terminal of the second amplifier 240 and the negative side input terminal of the fourth amplifier 252.

A variable capacitor C264 as a derivative element and a resistor R265 are connected in series as a feedforward control line between the in-phase input terminal 209a of the input terminal 209 of the limiter circuit 208 and the positive side input terminal of the fourth amplifier 252.

A variable capacitor C266 as a derivative element and a resistor R267 are connected in series as a feedforward control line between the reverse phase input terminal 209b of the input terminal 209 of the limiter circuit 208 and the negative side input terminal of the fourth amplifier 252.

The output terminals of the fourth amplifier 252 are connected individually to the quantizer 232 in which quantization processing is performed. The digital signal having undergone 3-bit quantization is inputted to the VDAC 233.

A variable resistor R268 and a capacitor C269 which is a derivative element are connected in series as a feedback control line between the VDAC 233 and the positive side input terminal of the fourth amplifier 252.

A variable resistor R270 and a capacitor C271 as a derivative element are connected in series as a feedback control line between the VDAC 233 and the negative side input terminal of the fourth amplifier 252.

The fourth amplifier 252 is also an adder of the input terminal 209 of the limiter circuit 208, the feedforward control lines of the output terminal of the first amplifier 236 and the output terminal of the second amplifier 240, and the feedback control line of the VDAC 233 as well as the integrator.

The digital signal having undergone 3-bit quantization by the quantizer 232 is improved in linearity by the DWA 234 and inputted to the digital signal processing part 116 downstream.

Meanwhile, the output signal of the DWA 234 is also inputted to the IDAC 235. The output terminals of the IDAC 235 are connected to the individual input terminals of the first amplifier 236 as feedback control lines.

As described above, the $\Delta\Sigma$ A/D converter 231 is constituted of the integrators which are in four stages, the quantizer 232, the feedback control lines and the feedforward control lines.

Fifth Embodiment

Circuit Configuration of Limiter Circuit 208

The $\Delta\Sigma$ A/D converter 231 described for the fourth embodiment is a current-input A/D converter. The limiter circuit 208 applied to the $\Delta\Sigma$ A/D converter 231 like this only has to satisfy the following conditions:

(1) Upon detection of excess input, the in-phase input terminal 209a and reverse phase input terminal 209b, which are on the input side, are set at the midpoint potential.

(2) Upon detection of excess input, the constant current source is connected to P212 and P213, which are on the output side. The circuit should be designed in consideration of characteristics of used devices, satisfying the above conditions.

The limiter circuit 208 illustrated for the fourth embodiment does not include transistor switches that intervene in the signal paths in normal operation, and is a circuit suitable for the case of anticipating distortion ratios of transistor switches. On the contrary, the resistance values of the resistors which alternately connect the in-phase input terminal 209a and reverse phase input terminal 209b should be made uniform. Since the ON resistances of the transistor switches are not absolutely zero, in consideration of combined resistances of the resistors connecting the in-phase input terminal 209a and reverse phase input terminal 209b and the ON resistances of the transistor switches, the combined resistance values should be made uniform compared with each other. The resistance values that are not uniform cause a bias between the potentials of the in-phase input terminal 209a and reverse phase input terminal 209b, resulting in deterioration of linearity of the output signal of the $\Delta\Sigma$ A/D converter 231.

Figure 15:
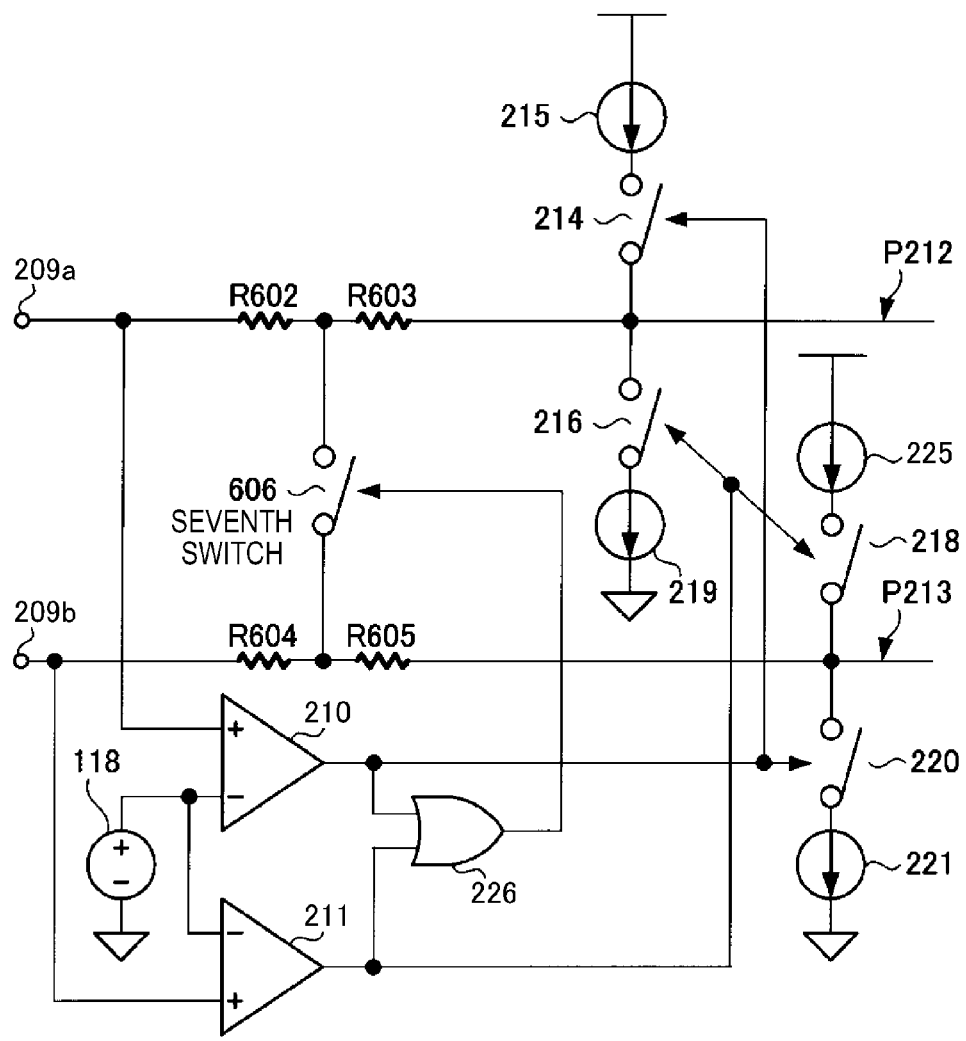
FIG. 15 is a circuit diagram of a limiter circuit according to a fifth embodiment.

FIG. 15 is a circuit diagram of a limiter circuit 601 according to a fifth embodiment. In addition, circuit elements common to those of the limiter circuit 208 according to the first embodiment are provided with the same reference characters and their description is omitted. Moreover, the $\Delta\Sigma$ A/D converter 231 following the limiter circuit 601 has the same configuration as in the fourth embodiment and its illustration and description are omitted.

To the in-phase input terminal 209a, resistors R602 and R603 are connected in series, and to the reverse phase input terminal 209b, resistors R604 and R605 are connected in series. The resistors R602 and R604 have the same resistance value and the resistors R603 and R605 also have the same resistance value.

A seventh switch 606 is connected between the connection node of the resistors R602 and R603 and the connection node of the resistors R604 and R605.

In normal operation, the seventh switch 606 is turned OFF, and in case of excess input detected by any of the first comparator 203 and second comparator 211, the seventh switch 606 is controlled to be ON.

Operations of the third switch 214, fourth switch 216, fifth switch 218 and sixth switch 220 are same as those in the fourth embodiment and their description is omitted.

Similarly to the fourth embodiment, the limiter circuit 601 illustrated for the fifth embodiment in FIG. 15 also does not include transistor switches that intervene in the signal paths in normal operation, and is a circuit suitable for the case of anticipating distortion ratios of transistor switches.

In the case of the limiter circuit 601 according to the fifth embodiment, since the in-phase input terminal 209a and reverse phase input terminal 209b are not alternately connected different from the case of the fourth embodiment, the resistance values do not have to be made uniform. Meanwhile, the ON resistance of the seventh switch 606 should be sufficiently small compared with those of the resistors R603 and R605.

In the case of the limiter circuit 601 according to the fifth embodiment, since change in input impedance during ON/OFF operation of the limiter circuit 601 is smaller compared with the case of the limiter circuit 208 according to the fourth embodiment, design for impedance matching does not have to be considered. Accordingly, the design steps for the limiter circuit 601 itself can be further reduced.

Sixth Embodiment

Circuit Configuration of Limiter Circuit 208

Figure 16:
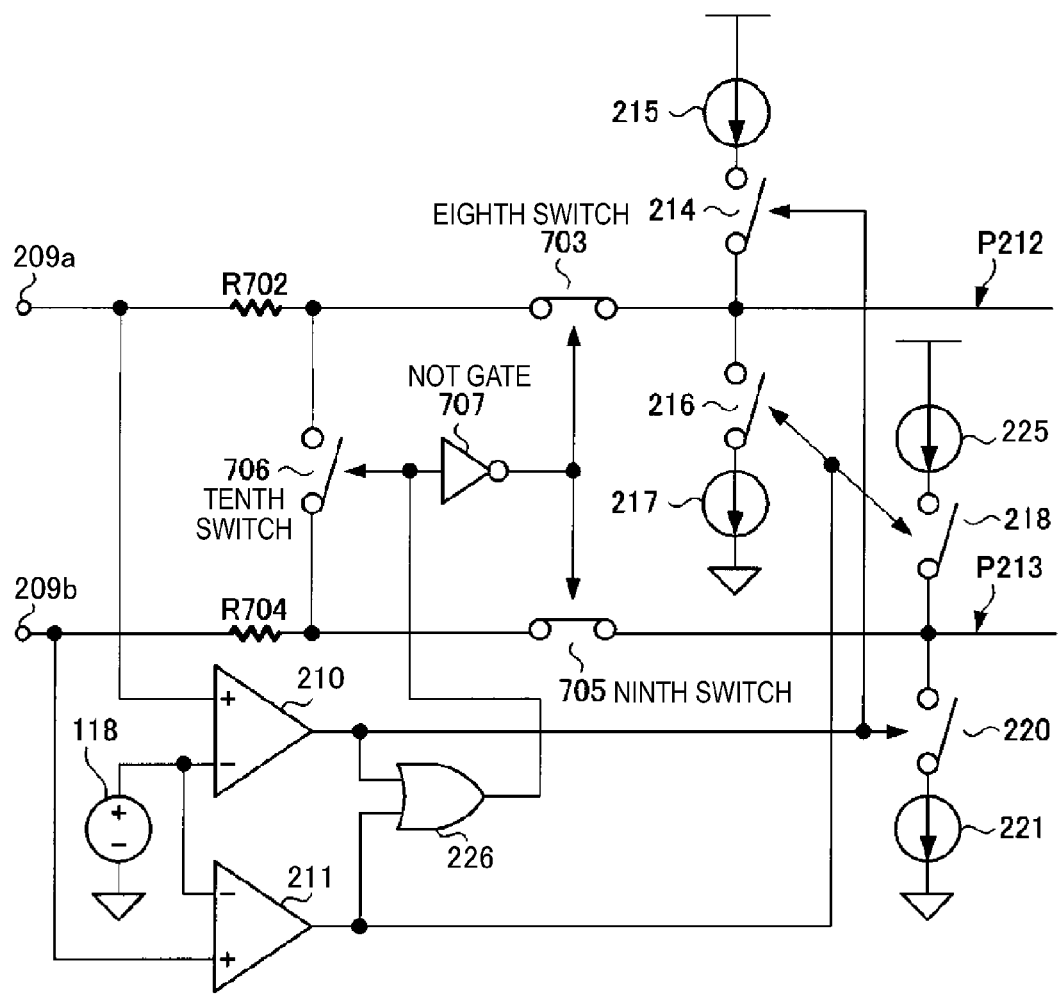
FIG. 16 is a circuit diagram of a limiter circuit according to a sixth embodiment.
Figure 17:
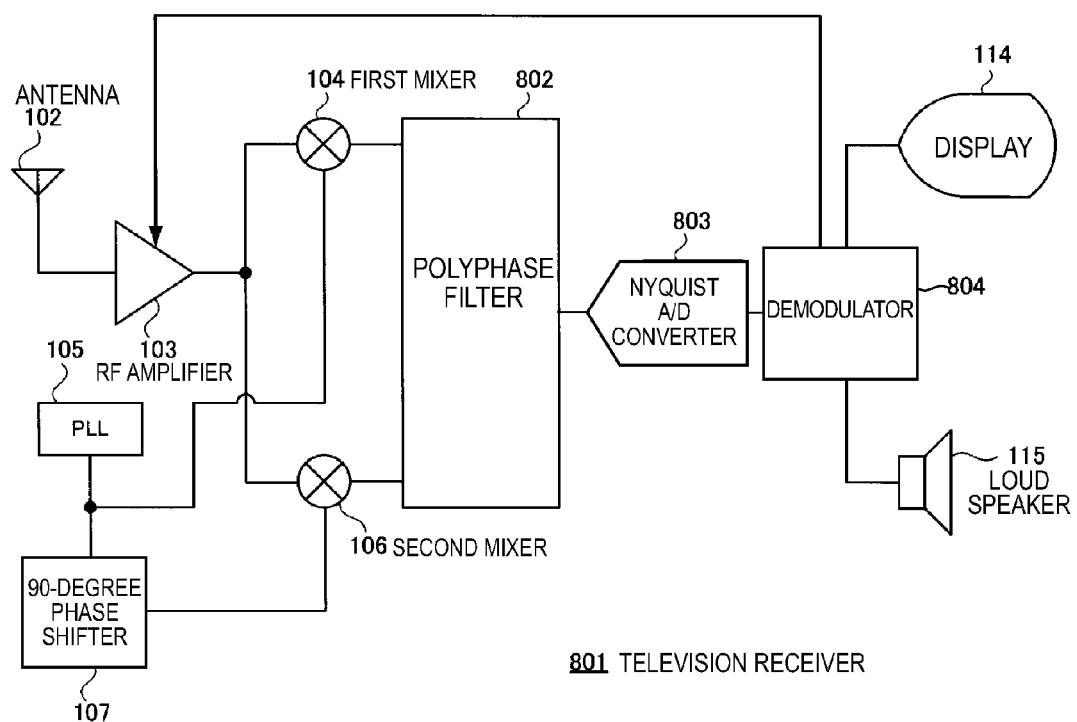
FIG. 17 is a block diagram of a television receiver according to an existing technology.

FIG. 16 is a circuit diagram of a limiter circuit 701 according to a sixth embodiment. In addition, circuit elements common to those of the limiter circuit 208 according to the first embodiment are provided with the same reference characters and their description is omitted. Moreover, the ΔΣ A/D converter 231 following the limiter circuit 701 has the same configuration as in the fourth embodiment and its illustration and description are omitted.

To the in-phase input terminal 209a, a resistor R702 and an eighth switch 703 are connected in series, and to the reverse phase input terminal 209b, a resistor R704 and a ninth switch 705 are connected in series.

A tenth switch 706 is connected between the connection node of the resistor R702 and eighth switch 703 and the connection node of the resistor R704 and ninth switch 705.

A tenth switch 706 is turned ON or OFF according to the output signal of the OR gate 226. On the other hand, the eighth switch 703 and ninth switch 705 are turned ON or OFF according to a signal obtained by inverting a logical state of the OR gate 226 by a NOT gate 707.

In normal operation, the eighth switch 703 and ninth switch 705 are turned ON and the tenth switch 706 is turned OFF.

In case of excess input detected by any of the first comparator 210 and second comparator 211, the eighth switch 703 and ninth switch 705 are inverted to be OFF and the tenth switch 706 is inverted to be ON.

In such a case for the limiter circuit 701 according to the sixth embodiment, since the input terminal 209 is shut from the ΔΣ A/D converter 231, the values of resistors connecting the in-phase input terminal 209a and reverse phase input terminal 209b do not have to be considered different from the cases of the fourth embodiment and fifth embodiment. Meanwhile, the transistor switches intervene in the signal paths in normal operation. Accordingly, this is a circuit not suitable for the case of anticipating distortion ratios of transistor switches.

As to selection of any of the circuits in the fourth embodiment, fifth embodiment and sixth embodiment, the most suitable circuit is to be selected in consideration of the points to how much extent unevenness of the resistors can be suppressed and to how much extent distortion ratios caused by distortion of the transistor switches affect the signals.

The embodiments described above can be applied to examples as follows.

(1) The above-mentioned limiter circuits 208, 601 and 701 that are provided upstream of the ΔΣ A/D converter 231 prevent malfunction of the ΔΣ A/D converter 231 before happens. Since the ΔΣ A/D converter 231 is a highly general-purpose circuit, the limiter circuits according to the embodiments can be applied to all kinds of electronic equipment employing a ΔΣ A/D converter. The application range can include, for example, portable wireless terminals, audio devices, various control devices, and the like as various application targets, as well as television receivers.

(2) In the cases of the above-mentioned limiter circuits 208, 601 and 701, the ΔΣ A/D converter 231 receives the input as current input, the operation of the limiter circuits expecting usage of the constant current sources. When the ΔΣ A/D converter receives voltage input with high impedance, as illustrated in FIG. 1, constant voltage sources only have to be applied in place of the constant current sources.

(3) The present technology may also be configured as below.
<1> A limiter circuit including:
  a reference voltage source outputting a reference voltage equal to an allowed input voltage of the delta-sigma A/D converter;
  a comparator comparing the reference voltage of the reference voltage source with a voltage of an input signal to convert a logical state when the voltage of the input signal exceeds the reference voltage; and
  a switch circuit providing, upon the comparator determining that the voltage of the input signal exceeds the reference voltage, a signal at a level equal to a level of the reference voltage to an input terminal of the delta-sigma A/D converter.
<2> The limiter circuit according to <1>,
  wherein the reference voltage source includes
  a first reference voltage source outputting a first reference voltage equal to an allowed input voltage of an in-phase input terminal of the delta-sigma A/D converter, and
  a second reference voltage source outputting a second reference voltage equal to an allowed input voltage of a reverse phase input terminal of the delta-sigma A/D converter,
  wherein the comparator includes
  a first comparator comparing a voltage of an in-phase input signal as the input signal which is a differential analog signal with the first reference voltage, and
  a second comparator comparing a voltage of a reverse phase input signal as the input signal with the second reference voltage, and
  wherein the switch circuit includes
  a first switch circuit connecting, upon the first comparator determining that the voltage of the in-phase input signal exceeds the first reference voltage, a current source at a level equal to a level of the first reference voltage to the in-phase input terminal of the delta-sigma A/D converter, and
  a second switch circuit connecting, upon the second comparator determining that the voltage of the reverse phase input signal exceeds the second reference voltage, a current source at a level equal to a level of the second reference voltage to the reverse phase input terminal of the delta-sigma A/D converter.
<3> The limiter circuit according to <1> or <2>,
  wherein the delta-sigma A/D converter includes integrators in three or more stages.

<4> A television receiver including:
an RF amplifier amplifying a radio wave received from an antenna;
a local oscillator;
a 90-degree phase shifter performing 90-degree phase shift on a phase of a signal outputted by the local oscillator;
a first mixer connected to the RF amplifier and the local oscillator and outputting an I-channel signal which is an intermediate frequency signal;
a second mixer connected to the RF amplifier and the 90-degree phase shifter and outputting a Q-channel signal which is an intermediate frequency signal;
a first delta-sigma A/D converter;
a first limiter circuit providing, when a voltage of the I-channel signal exceeds an allowed input voltage of the first delta-sigma A/D converter, a signal at a level equal to a level of the allowed input voltage to an input terminal of the first delta-sigma A/D converter;
a second delta-sigma A/D converter;
a second limiter circuit providing, when a voltage of the Q-channel signal exceeds an allowed input voltage of the first delta-sigma A/D converter, a signal at a level equal to a level of the allowed input voltage to an input terminal of the second delta-sigma A/D converter; and
a digital signal processing part receiving a digital I-channel signal outputted from the first delta-sigma A/D converter and a digital Q-channel signal outputted from the second delta-sigma A/D converter to perform predetermined filter processing and demodulation processing.

<5> The television receiver according to <4>,
wherein the first limiter circuit includes
a first reference voltage source outputting a first reference voltage equal to an allowed input voltage of an in-phase input terminal of the first delta-sigma A/D converter,
a second reference voltage source outputting a second reference voltage equal to an allowed input voltage of a reverse phase input terminal of the first delta-sigma A/D converter,
a first comparator comparing a voltage of an in-phase input signal as the I-channel signal which is a differential analog signal with the first reference voltage,
a second comparator comparing a voltage of a reverse phase input signal as the I-channel signal with the second reference voltage,
a first switch circuit connecting, upon the first comparator determining that the voltage of the in-phase input signal as the I-channel signal exceeds the first reference voltage, a current source at a level equal to a level of the first reference voltage to the in-phase input terminal of the first delta-sigma A/D converter, and
a second switch circuit connecting, upon the second comparator determining that the voltage of the reverse phase input signal as the I-channel signal exceeds the second reference voltage, a current source at a level equal to a level of the second reference voltage to the reverse phase input terminal of the first delta-sigma A/D converter, and
wherein the second limiter circuit includes
a third reference voltage source outputting a third reference voltage equal to an allowed input voltage of an in-phase input terminal of the second delta-sigma A/D converter,
a fourth reference voltage source outputting a fourth reference voltage equal to an allowed input voltage of a reverse phase input terminal of the second delta-sigma A/D converter,
a third comparator comparing a voltage of an in-phase input signal as the Q-channel signal which is a differential analog signal with the third reference voltage,
a fourth comparator comparing a voltage of a reverse phase input signal as the Q-channel signal with the fourth reference voltage,
a third switch circuit connecting, upon the third comparator determining that the voltage of the in-phase input signal as the Q-channel signal exceeds the third reference voltage, a current source at a level equal to a level of the third reference voltage to the in-phase input terminal of the second delta-sigma A/D converter, and
a fourth switch circuit connecting, upon the fourth comparator determining that the voltage of the reverse phase input signal as the Q-channel signal exceeds the fourth reference voltage, a current source at a level equal to a level of the fourth reference voltage to the reverse phase input terminal of the second delta-sigma A/D converter.

<6> The television receiver according to <4> or <5>,
wherein the first delta-sigma A/D converter and the second delta-sigma A/D converter each include integrators in three or more stages.

According to the embodiments, the television receiver 101 and the limiter circuit 208 applied to the $\Delta\Sigma$ A/D converter 231 used for the same are disclosed.

The input signal is compared with the reference voltage of the reference voltage source which voltage is an allowable voltage of the $\Delta\Sigma$ A/D converter, and when the input signal exceeds the reference voltage, the constant current source in place of the input signal is connected to the input terminal of the $\Delta\Sigma$ A/D converter 231. By doing so, malfunction of the $\Delta\Sigma$ A/D converter 231 is prevented before happens.

The limiter circuits disclosed in the embodiments enable a Nyquist A/D converter used before to be replaced by a $\Delta\Sigma$ A/D converter easily. The limiter circuit releases a dynamic range of the input signal and/or a measure for quick recovery against malfunction of the $\Delta\Sigma$ A/D converter in circuit designing from being considered even in case of usage of the $\Delta\Sigma$ A/D converter operating in a multi-stage manner, affording good news to engineers who design electronic equipment.

As above, the exemplary embodiments according to the present disclosure have been described, whereas the present disclosure is not limited to the above-mentioned exemplary embodiments but it should be understood by those skilled in the art that various modifications, combinations, sub-combinations and alterations may occur depending on design requirements and other factors insofar as they are within the scope of the appended claims or the equivalents thereof.

For example, the above-mentioned exemplary embodiments are described for explaining configurations of devices and systems in detail and specifically in order to explaining the present disclosure but not for necessarily limiting it to ones including all of the configurations thus described. Moreover, part of the configuration in the embodiment can be replaced by a configuration in any other embodiment and such a configuration in any other embodiment can also be added to the configuration in the embodiment. Moreover, any other configuration can be added, eliminated and/or replaced for part of the configuration in the embodiment.

Moreover, the above-mentioned configurations, functions and processing parts each may be implemented using hardware by designing part or all thereof, for example, as an integrated circuit. Moreover, the above-mentioned configurations, functions and the like may be implemented using software to interpret and execute programs with which a processor realizes functions. Information such as the programs, tables, files and the like for realizing the functions may be stored in a volatile or non-volatile storage such as a memory, hard disk drive and SSD (Solid State Drive) or a recording medium such as an IC card and optical disk.

Moreover, the control lines and information lines expected for the description are illustrated and all the control lines and information lines are not necessarily illustrated. Actually, it may be considered that almost all the configurations are connected to one another.

The present disclosure contains subject matter related to that disclosed in Japanese Priority Patent Application JP 2012-186724 filed in the Japan Patent Office on Aug. 27, 2012, and Japanese Priority Patent Application JP 2012-186726 filed in the Japan Patent Office on Aug. 27, 2012, the entire contents of which are hereby incorporated by reference.

What is claimed is:

1. A delta-sigma A/D converter comprising:
   a first integrator;
   a second integrator located on an output side of the first integrator;
   a quantizer located on an output side of the second integrator;
   a first current D/A converter receiving an output of the quantizer and providing a negative feedback signal to an input side of the quantizer; and
   a second current D/A converter receiving the output of the quantizer and providing a negative feedback signal to an input side of the first integrator,
      wherein a differential analog signal is inputted to the first integrator, the second integrator and the quantizer, and
      wherein the first current D/A converter includes a plurality of current source units each including a first current source connected between an in-phase signal line for the differential analog signal and a ground, and a second current source connected between a reverse phase signal line for the differential analog signal and the ground.

2. The delta-sigma A/D converter according to claim 1, further comprising:
   a limiter circuit, wherein the limiter circuit includes
      a reference voltage source outputting a reference voltage equal to an allowed input voltage of the delta-sigma A/D converter;
      a comparator comparing the reference voltage of the reference voltage source with a voltage of an input signal to convert a logical state when the voltage of the input signal exceeds the reference voltage; and
      a switch circuit providing, upon the comparator determining that the voltage of the input signal exceeds the reference voltage, a signal at a level equal to a level of the reference voltage to an input terminal of the delta-sigma A/D converter.

3. The delta-sigma A/D converter according to claim 2, wherein the reference voltage source includes
      a first reference voltage source outputting a first reference voltage equal to an allowed input voltage of an in-phase input terminal of the delta-sigma A/D converter, and
      a second reference voltage source outputting a second reference voltage equal to an allowed input voltage of a reverse phase input terminal of the delta-sigma A/D converter,
   wherein the comparator includes
      a first comparator comparing a voltage of an in-phase input signal as the input signal which is a differential analog signal with the first reference voltage, and
      a second comparator comparing a voltage of a reverse phase input signal as the input signal with the second reference voltage, and
   wherein the switch circuit includes
      a first switch circuit connecting, upon the first comparator determining that the voltage of the in-phase input signal exceeds the first reference voltage, a current source at a level equal to a level of the first reference voltage to the in-phase input terminal of the delta-sigma A/D converter, and
      a second switch circuit connecting, upon the second comparator determining that the voltage of the reverse phase input signal exceeds the second reference voltage, a current source at a level equal to a level of the second reference voltage to the reverse phase input terminal of the delta-sigma A/D converter.

4. The delta-sigma A/D converter according to claim 3, wherein the delta-sigma A/D converter includes integrators in three or more stages.

5. A delta-sigma A/D converter comprising:
   a first integrator;
   a second integrator located on an output side of the first integrator;
   a quantizer located on an output side of the second integrator;
   a first current D/A converter receiving an output of the quantizer and providing a negative feedback signal to an input side of the quantizer; and
   a limiter circuit, wherein the limiter circuit includes
      a reference voltage source outputting a reference voltage equal to an allowed input voltage of the delta-sigma A/D converter;
      a comparator comparing the reference voltage of the reference voltage source with a voltage of an input signal to convert a logical state when the voltage of the input signal exceeds the reference voltage; and
      a switch circuit providing, upon the comparator determining that the voltage of the input signal exceeds the reference voltage, a signal at a level equal to a level of the reference voltage to an input terminal of the delta-sigma A/D converter.

* * * * *